United States Patent
Miki et al.

(10) Patent No.: US 10,297,291 B2
(45) Date of Patent: May 21, 2019

(54) SEMICONDUCTOR DEVICE

(71) Applicant: Renesas Electronics Corporation, Tokyo (JP)

(72) Inventors: Takeo Miki, Tokyo (JP); Yuji Yano, Tokyo (JP); Hideaki Abe, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/590,098

(22) Filed: May 9, 2017

(65) Prior Publication Data
US 2018/0025755 A1   Jan. 25, 2018

(30) Foreign Application Priority Data

Jul. 20, 2016 (JP) ................................. 2016-142612

(51) Int. Cl.
| G11C 5/14 | (2006.01) |
| G06F 3/06 | (2006.01) |
| G11C 15/04 | (2006.01) |
| H03K 19/00 | (2006.01) |
| H04L 12/743 | (2013.01) |

(52) U.S. Cl.
CPC .............. *G11C 5/14* (2013.01); *G06F 3/0683* (2013.01); *G11C 15/04* (2013.01); *H03K 19/0016* (2013.01); *H04L 45/7457* (2013.01)

(58) Field of Classification Search
CPC .......... G11C 5/14; G11C 15/04; G06F 3/0683
See application file for complete search history.

(56) References Cited

U.S. PATENT DOCUMENTS

| 6,373,738 B1* | 4/2002 | Towler | G11C 15/04 |
| | | | 365/189.07 |
| 6,731,526 B2 | 5/2004 | Inoue | |
| 8,984,217 B2 | 3/2015 | Shen et al. | |
| 2003/0137890 A1* | 7/2003 | Vlasenko | G11C 15/00 |
| | | | 365/207 |
| 2013/0326111 A1* | 12/2013 | Arsovski | G11C 15/04 |
| | | | 711/102 |

FOREIGN PATENT DOCUMENTS

| JP | H 06-333395 A | 12/1994 |
| JP | 2003-272386 A | 9/2003 |
| JP | 2013-537680 A | 10/2013 |

* cited by examiner

*Primary Examiner* — Mohammed A Bashar
(74) *Attorney, Agent, or Firm* — McGinn I.P. Law Group, PLLC.

(57) ABSTRACT

The present invention provides a semiconductor device that can reduce the power consumption. The semiconductor device includes a plurality of sub-blocks each including a memory cell array, and a plurality of sub-search units corresponding to the respective sub-blocks. Of the data stored in each row of the memory cell array, each sub-block searches for data that matches the input search data according to a search instruction, and outputs a search result indicating hit or miss for each row. Each sub-search unit includes a flag data generation part that generates flag data for presearch to compare with part of the input search data based on the data stored in the corresponding memory cell array, and a search part that compares part of the input search data with the flag data generated by the flag data generation part, and outputs the search instruction to the corresponding sub-block based on the comparison result.

19 Claims, 21 Drawing Sheets

| SRAM CELL (X CELL) | SRAM CELL (Y CELL) | TCAM CELL DATA |
|---|---|---|
| "1" | "0" | "0" |
| "0" | "1" | "1" |
| "0" | "0" | "*" (don't care) |
| "1" | "1" | NOT IN USE |

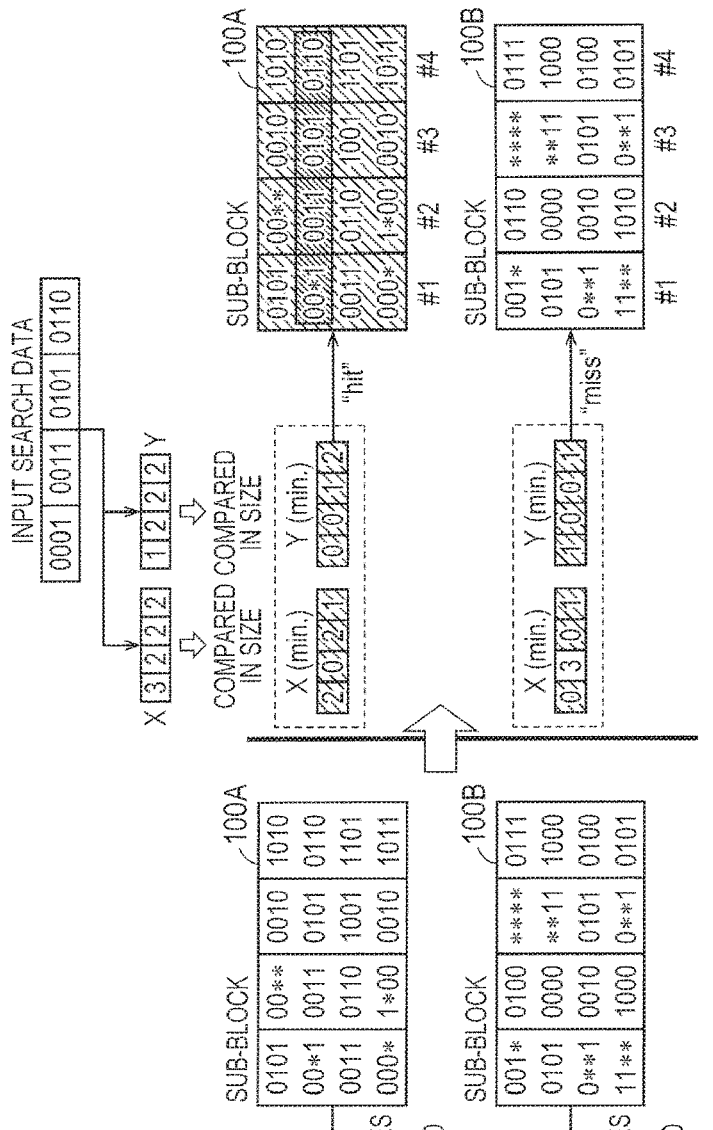
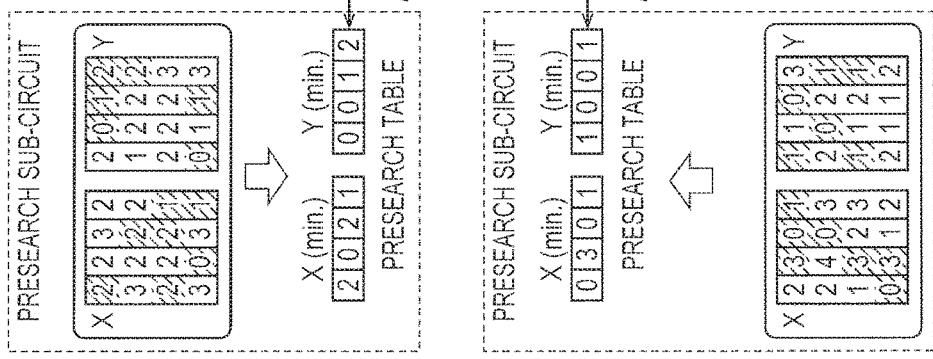
FIG. 25A
FIG. 25B

SEMICONDUCTOR DEVICE

CROSS-REFERENCE TO RELATED APPLICATIONS

The disclosure of Japanese Patent Application no. 2016-142612 filed on Jul. 20, 2016 including the specification, drawings and abstract is incorporated herein by reference in its entirety.

BACKGROUND

The present disclosure relates to a semiconductor device, for example, an associative memory.

A storage device called an associative memory or content addressable memory (CAM) is a device that searches for a data word matching a search word from data words stored in the storage device, and when finding a matching data word, outputs the address.

There are two types of CAM: binary CAM (BCAM) and ternary CAM (TCAM). Each memory cell of BCAM stores information of either "0" or "1". However, in the case of TCAM, each memory cell can store information of "Don't Care" (an asterisk "*" is used in this example), in addition to information of "0" or "1". Note that "*" indicates that either "0" or "1" is available.

The TCAM device is widely used for address search and access control in routers for networks such as the Internet. In order to deal with an increase in the capacity, the TCAM device is generally configured with a plurality of arrays to simultaneously perform a search operation on each of the arrays.

The TCAM device, which can simultaneously compare input search data (input packet) with TCAM cell data, is faster than the random access memory (RAM) in all search applications. However, a problem is that the power consumption is increased because a search current is generated in the search.

In this regard, Japanese Unexamined Patent Application Publication No. Hei 6(1994)-333395 (Patent Document 1) discloses a configuration that narrows down blocks to be search by inputting a block selection signal for selecting blocks in order to reduce the power consumption. However, it is necessary to provide the selection signal for selecting blocks in advance and the configuration is complicated.

Further, Japanese Unexamined Patent Application Publication (Translation of PCT Application) No. 2013-537680 (Patent Document 2) discloses a configuration in which no power is supplied to areas with no valid data based on the presence or absence of valid data (data word) in the memory array. However, when a data word is present, power supply is performed, so that it is difficult to obtain a sufficiently low power consumption effect.

Further, Japanese Unexamined Patent Application Publication No. 2003-272386 (Patent Document 3) discloses a TCAM device configured such that a plurality of sub-arrays are arranged in a match line direction and are coupled in a pipe line manner to reduce the power consumption. The TCAM device of this document performs a search, in the subsequent stage, only on entries that match in the previous stage.

SUMMARY

However, in the associative memory, TCAM cells that are set to "Don't Care" may be present together in a certain range. For example, it often occurs that the TCAM cells coupled to a match line, which is part of the sub-array, are all set to "Don't Care". In such a case, the user himself/herself should optimize the data of the database in advance to narrow down the blocks to be activated, thus making management complex. In addition, it requires more analysis time for the update time to maintain the database, so that it is difficult to achieve both low power consumption effect and performance.

The present disclosure has been made to solve the above problems and an object of the present disclosure is to provide a semiconductor device that can achieve low power consumption.

Other problems and novel features will become apparent from the description of this specification and the accompanying drawings.

According to an embodiment, a semiconductor device includes a plurality of sub-blocks each of which includes a memory array, and a plurality of sub-search units provided corresponding to each of the sub-blocks. Of a plurality of data stored in each line of the memory array, each sub-block searches for data that matches input search data according to a search instruction. Then, the sub-block outputs search results indicating hit or miss for each row. Each sub-search unit includes a flag data generation part that generates flag data for presearch in order to compare with part of the input search data based on the data that are stored in the corresponding memory cell array, as well as a search part that compares part of the input search data with the flag data generated by the flag data generation unit, and outputs the search instruction to the corresponding sub-block based on the comparison result.

According to an embodiment, it is possible to reduce the power consumption.

BRIEF DESCRIPTION OF THE DRAWINGS

FIGS. 25A and 25B are diagrams showing the presearch operation of the presearch sub-circuit based on a variation of the third embodiment.

DETAILED DESCRIPTION

Figures 1, 2:
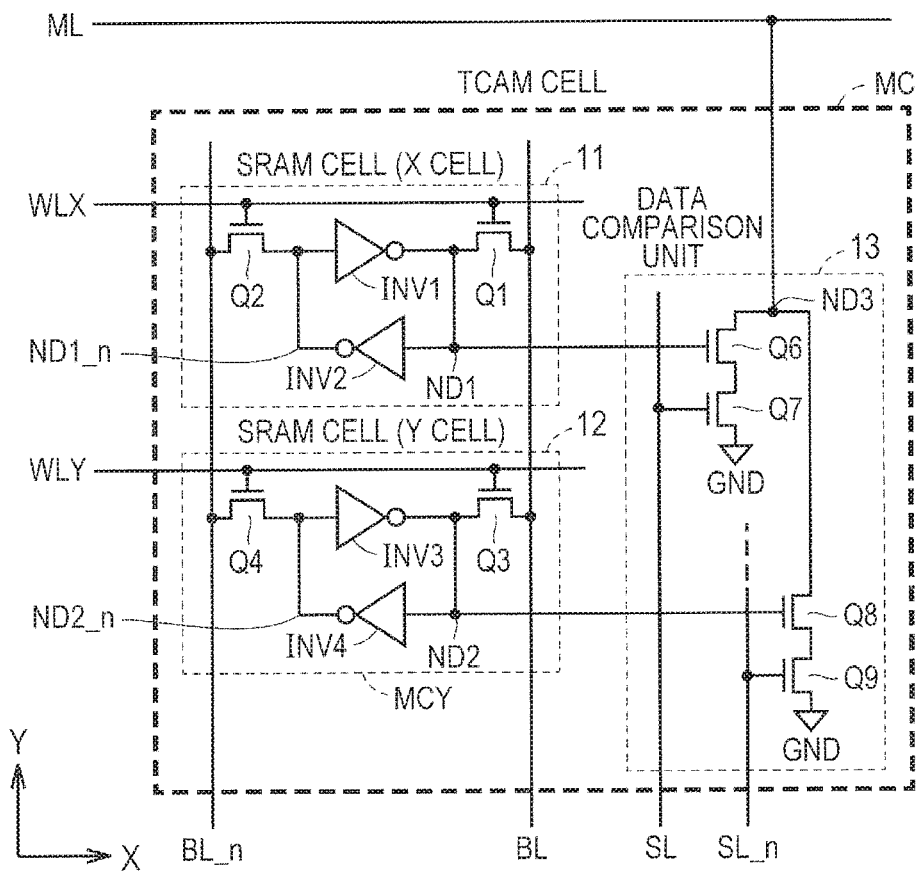
FIG. 1 is a circuit diagram showing an example of the configuration of a TCAM cell.
FIG. 2 is a diagram showing the correspondence between the TCAM data and the memory contents of the X cell and Y cell of FIG. 1, in tabular form.

Preferred embodiments will be described in detail with reference to the accompanying drawings. Note that like or corresponding parts are designated by like reference numerals and the description thereof will not be repeated.

First Embodiment

<A. Hardware Configuration>

[a1. Configuration of the TCAM Cell]

Referring to FIG. 1, a TCAM cell (also referred to as a memory cell MC) includes two SRAM (Static Random Access Memory) cells 11 and 12, and a data comparison unit 13. The SRAM cell 11 is also referred to as the X cell. Further, the SRAM cell is also referred to as the Y cell. The X cell 11 stores 1-bit data that are complementary to each other (when one is "1", the other is "0") with respect to an internal memory node pair ND1, ND1_n. The Y cell 12 stores 1-bit data that are complementary to each other with respect to an internal memory node pair ND2, ND2_n.

The TCAM cell is coupled to a bit line pair BL, BL_n, a search line pair SL, SL_n, a match line ML, and word lines WLX and WLY. The bit line pair BL, BL_n extends in the column direction (Y direction) of the TCAM cell array 20 shown in FIG. 3, and is shared by a plurality of TCAM cells arranged in the column direction. The search line pair SL, SL_n extends in the column direction (Y direction) of the TCAM cell array 20, and is shared by the TCAM cells arranged in the column direction.

The match line ML extends in the row direction (X direction) of the TCAM cell array 20, and is shared by a plurality of TCAM cells arranged in the row direction. The word lines WLX and WLY extend in the row direction (X direction) of the TCAM cell array 20, which are shared by the TCAM cells arranged in the row direction.

The X cell 11 includes inverters INV1 and INV2, and N-channel metal oxide semiconductor (MOS) transistors Q1 and Q2. The inverter INV1 is coupled between the memory node ND1 and the memory node ND1_n in such a way that the direction from the memory node ND1_n to the memory node ND1 is the forward direction. The inverter INV2 is coupled in parallel to INV1 in the direction opposite to the direction of INV1. The MOS transistor Q1 is coupled between the memory node ND1 and the bit line BL. The MOS transistor Q2 is coupled between the memory node ND1_n and the bit line BL_n. The gates of the MOS transistors Q1 and Q2 are coupled to the word line WLX.

The Y cell 12 includes inverters INV3 and INV4, and metal oxide semiconductor (MOS) transistors Q3 and Q4. The inverter INV3 is coupled between the memory node ND2 and the memory node ND2_n in such a way that the direction from the memory node ND2_n to the memory node ND2 is the forward direction. The inverter INV4 is coupled in parallel to INV3 in the direction opposite to the direction of INV3. The MOS transistor Q3 is coupled between the memory node ND2 and the bit line BL. The MOS transistor Q4 is coupled between the memory node ND2_n and the bit line BL_n. The gates of the MOS transistors Q3 and Q4 are coupled to the word line WLY.

The data comparison unit 13 includes N-channel MOS transistors Q6 to Q9. The MOS transistors Q6 and Q7 are coupled in series between the node ND3, which is a connection point to the match line ML, and a ground node GND. The MOS transistors Q8 and Q9 are coupled in series between the node ND3 and the ground node GND, which are also coupled in parallel to the serially coupled MOS transistors Q6 and Q7. The gates of the MOS transistors Q6 and Q8 are respectively coupled to the memory nodes ND1 and ND2. The gates of the MOS transistors Q7 and Q9 are respectively coupled to the search lines SL and SL_n.

FIG. 2 is a diagram showing the correspondence between the TCAM data and the memory contents of the X cell and Y cell of FIG. 1, in tabular form.

Referring to FIGS. 1 and 2, the TCAM cell can store three values of "0", "1", and "*" (Don't Care) by using a 2-bit SRAM cell. More specifically, it is assumed that "0" is stored in the TCAM cell when "1" is stored in the memory node ND1 of the X cell 11 and "0" is stored in the memory node ND2 of the Y cell 12. Then, it is assumed that "1" is stored in the TCAM cell when "0" is stored in the memory node ND1 of the X cell 11 and "1" is stored in the memory node ND2 of the Y cell 12. Further, it is assumed that "*" (Don't Care) is stored in the TCAM cell when "0" is stored in the memory node ND1 of the X cell 11 and "0" is stored in the memory node ND2 of the Y cell 12. No data is used when "1" is stored in the memory node ND1 of the X cell 11 and "1" is stored in the memory node ND2 of the Y cell 12.

According to the configuration of the TCAM cell, the MOS transistors Q6 and Q7 are turned on, when the search data is "1" (namely, the search line SL is "1" and the search line SL_n is "0") and when the TCAM data is "0" (namely, the memory node ND1 is "1" and the memory node ND2 is "0"). Thus, the potential of the precharged match line ML is drawn to the ground potential. Further, the MOS transistors Q8 and W9 are turned on, when the search data is "0" (namely, the search line SL is "0" and the search line SL_n is "1") and when the TCAM data is "1" (in other words, the memory node ND1 is "0" and the memory node ND2 is "1"). Thus, the potential of the precharged match line ML is drawn to the ground potential. In other words, when the search data and the TCAM data do not match, the potential of the match line ML is drawn to the ground potential.

On the other hand, the potential of the precharged match line ML (the power supply potential VDD level) is maintained, when the input search data is "1" and the TCAM data is "1" or "*", or when the search data is "0" and the TCAM data is "0" or "*" (in other words, when the two data match).

As described above, in the TCAM, the charge stored in the match line ML is drawn unless the data of all TCAM cells, which are coupled to the match line ML corresponding to one entry (row), match the input search data. For this reason, the search in the TCAM is fast but the current consumption is high.

[a2. Configuration of the Sub-block]

Figure 3:
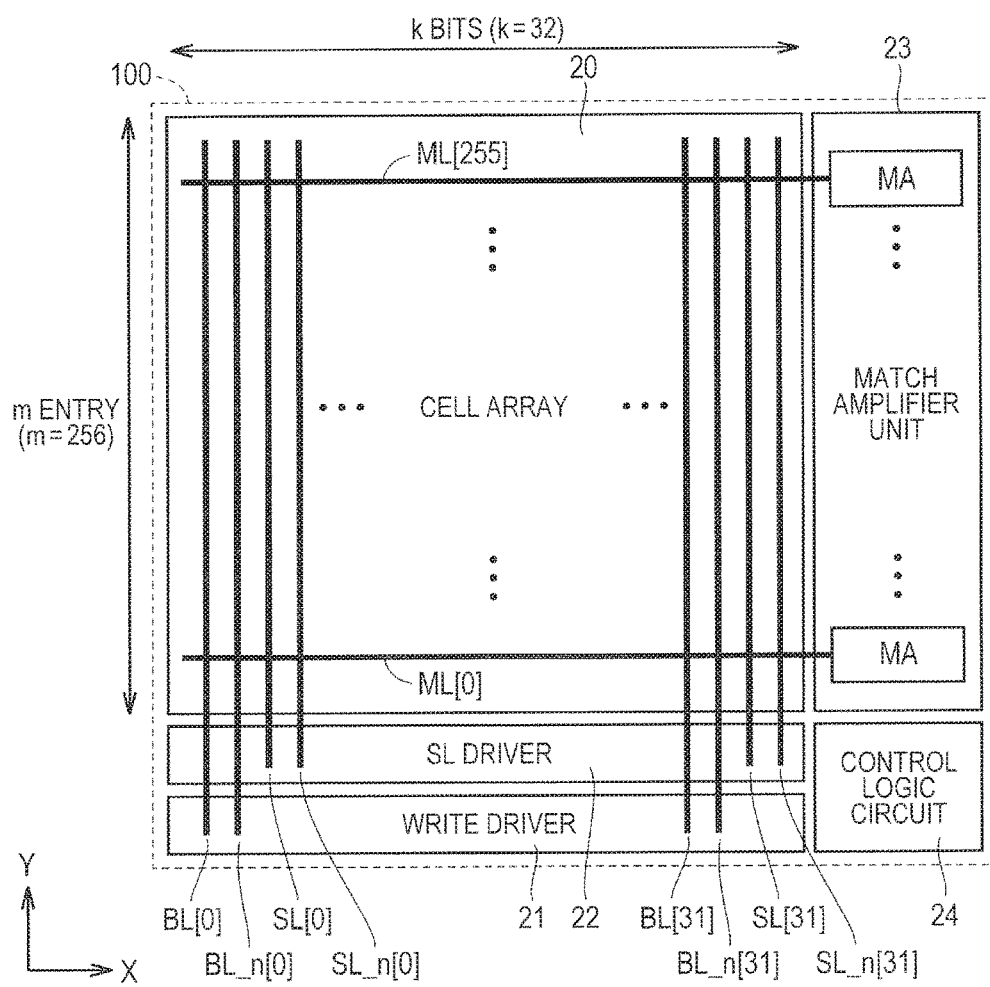
FIG. 3 is a block diagram showing the configuration of one sub-block that configures the TCAM device.

FIG. 3 is a block diagram showing the configuration of one sub-block that configures the TCAM device.

Referring to FIG. 3, a sub-block 100 includes a TCAM cell array 20 (also simply referred to as a cell array), a write driver 21, a search line driver 22, a match amplifier unit 23, and a control logic circuit 24. The sub-block 100 further includes a word line driver (not shown) for driving the word lines WLX and WLY shown in FIG. 1, an input/output circuit (not shown) for receiving input of control signals, address signals or other signals, and a read circuit (not shown).

The cell array 20 includes TCAM cells arranged in rows and columns (m rows, k columns). This example shows a case in which the number of rows (number of entries) m is 256 and the number of columns (number of bits) k is 32 in the cell array 20.

There are provided k (k=32) bit line pairs (from BL[0], B_n[0] to BL[k-1], BL_n[k-1]) and k (k=32) search line pairs (from SL[0], SL_n[0] to SL[k-1], SL_n[k-1]) corresponding to each of the columns of the cell array 20. Further, there are provided m (m=256) match lines (from ML[0] to ML[m-1]), m word lines for the X cell (from WLX [0] to WLX [m-1]) not shown, and m word lines for the Y cell (from WLY[0] to WLY[m-1]) not shown, corresponding to each of the rows of the cell array 20.

The write driver 21 provides write data to each TCAM cell through the bit line pair BL, BL_n in writing. The search line driver 22 provides search data to each TCAM cell through the search line pair SL, SL_n in searching.

The control logic circuit 24 controls the entire operation of the sub-array SA. For example, in searching, the control logic circuit 24 receives a search command, and outputs a control signal to the search line driver 22 and the match amplifier unit 23. In this way, the control logic circuit 24 controls the operation of the search line driver 22, the match amplifier unit 23, and the precharge circuit.

The match amplifier unit 23 includes a plurality of match amplifiers MA corresponding to each of the rows of the cell array. In searching, the match amplifier MA detects whether the corresponding TCAM cell data and the corresponding part of the input search data match or not, based on the potential of the corresponding match line ML. In this embodiment, the match amplifier MA includes a precharge circuit for precharging the corresponding match line ML in searching.

[a3. Configuration and Operation of the Search Line Driver]

Figure 4:
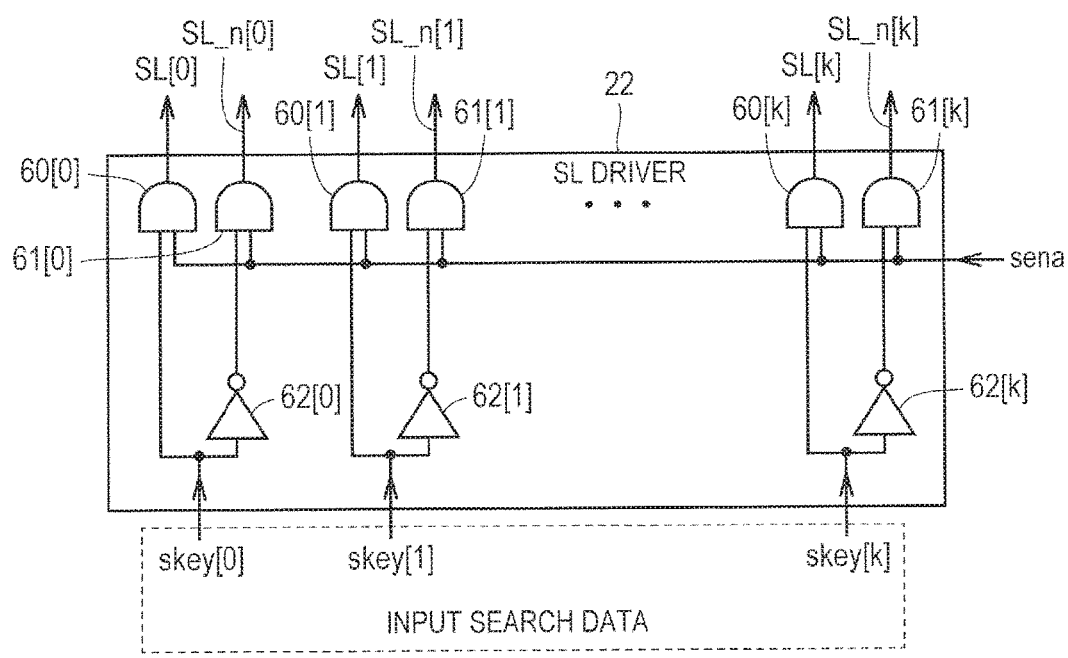
FIG. 4 is a circuit diagram showing an example of the configuration of a search line driver 22.

FIG. 4 is a circuit diagram showing an example of the configuration of the search line driver 22.

The search line driver 22 outputs input search data skey [i] (i=0, 1, . . ., k) when a search line enable signal sena is activated to the "H" level. At the same time, the search line driver 22 outputs a signal in which the logic level of the input search data skey [i] is inverted, to the complementary search line SL_n [i].

More specifically, the search line driver 22 includes AND gates 60 [0] to 60[k] corresponding to each of the search lines SL[0] to SL[k], AND gates 61[0] to 61[k] corresponding to each of the search lines SL_n[0] to SL_n[k], and inverters 62[0] to 62[k]. The search line enable signal sena is commonly input to the AND gates 60[0] to 60[k] as well as the AND gates 61[0] to 61[k]. Further, the corresponding input search data skey[i] is input to the AND gate 60[i] (i=0, 1, . . . , k).

The output signal of the AND gate 60[i] (i=0, 1, . . . , k) is transmitted to the search line SL[i]. The signal in which the corresponding input search data skey[i] is inverted is input to the AND gate 61[i] (i=0, 1, . . . , k).

According to the configuration described above, for example, when the search line enable signal sena is activated to the "H" level and when the input search data skey[i] is the "H" level ("1"), the voltage of the search line SL[i] is changed to the "H" level, and the voltage of the search line SL_n [i] is changed to the "L" level. When the search line enable signal sena is activated to the "H" level and when the input search data skey[i] is the "L" level ("0"), the voltage of the search line SL[i] is changed to the "L" level and the voltage of the search line SL_n [i] is changed to the "H" level.

[a4. Configuration and Operation of the Match Amplifier]

Figure 5:
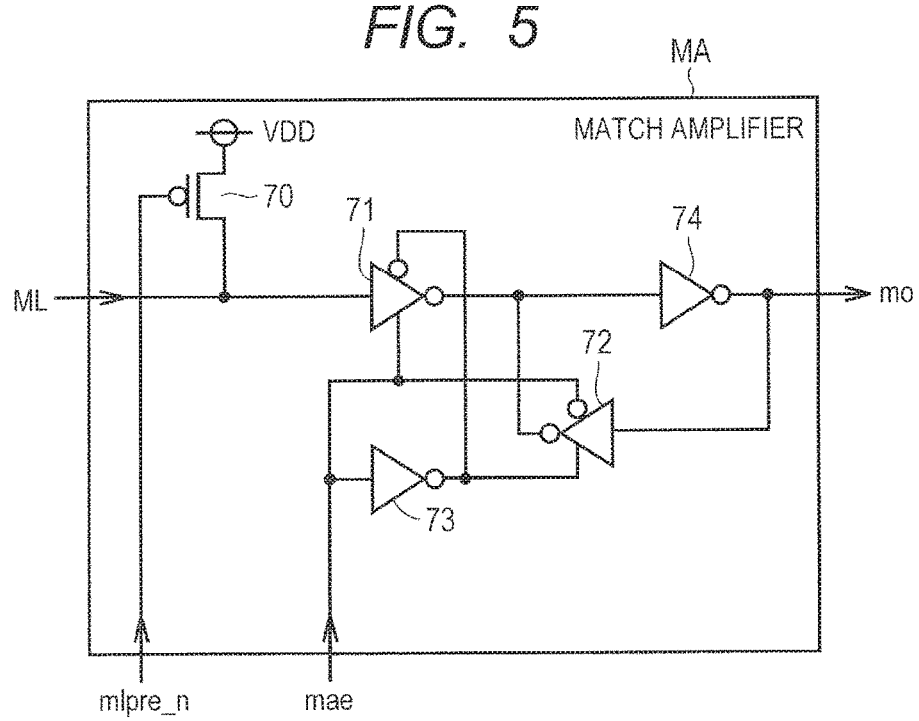
FIG. 5 is a circuit diagram showing an example of the configuration of a match amplifier.

FIG. 5 is a circuit diagram showing an example of the configuration of the match amplifier.

Referring to FIG. 5, the match amplifier MA includes a P-channel MOS transistor 70 as a precharge circuit, and inverters 71 to 74.

Although it is shown that the MOS transistor 70 as a precharge circuit is located inside the match amplifier MA, the MOS transistor 70 may be located outside the match amplifier MA. The control logic circuit 24 outputs a match line precharge signal mlpre_n and a match amplifier enable signal mae.

Hereinafter, the connection of these components will be described. The MOS transistor 70 is coupled between the corresponding match line ML and a power supply node that provides a power supply potential VDD. The match line precharge signal mlpre_n is input to the gate of the MOS transistor 70. The match line ML is further coupled to an input node of the inverter 71. An output node of the inverter 74 is coupled to an input node of the inverter 72 through the inverter 72.

The match amplifier enable signal mae, as well as the signal obtained by inverting the logic level of the match amplifier enable signal mae by the inverter 73 are coupled to drive power supply nodes of the inverters 71 and 72. When the match amplifier enable signal mae is in the inactive state ("L" level), the inverter 71 goes into the inactive state and the inverter 72 goes into the active state. When the match amplifier enable signal mae is in the active state ("H" level), the inverter 71 goes into the active state and the inverter 72 goes into the inactive state.

Next, the circuit operation of the match amplifier MA will be described. When the match line precharge signal mlpre_n is activated (or changed to the "L" level), the current flows through the MOS transistor 70. In this way, the match line ML is charged (precharged) to the power supply potential VDD.

After the match line precharge signal mlpre_n is inactivated, the search line enable signal sena is activated (ro changed to the "H" level), and then the search data is input to the search line pair Sl, Sl_n. In this way, the potential of the match line ML varies depending on the search results (the comparison results between the corresponding part of the input search data and the TCAM cell data). In other words, when the data match (hit), the potential of the match line ML is maintained at the power supply potential VDD ("H" level), and when the data do not match (miss), the charge of the match line ML is discharged to the ground node, so that the potential of the match line ML changes to the ground potential ("L" level).

Next, the match amplifier enable signal mae is activated (or changed to the "H" level). In this way, the potential of the match line ML based on the search result is output, as a match amplifier output signal mo, through the inverter 71 and the inverter 74. When the match amplifier enable signal mae is inactivated (or changed to the "L" level), the potential of the match line ML based on the search result is maintained by a latch circuit configured with the inverter 74 and the inverter 72.

[a5. Overall Configuration]

Figure 6:
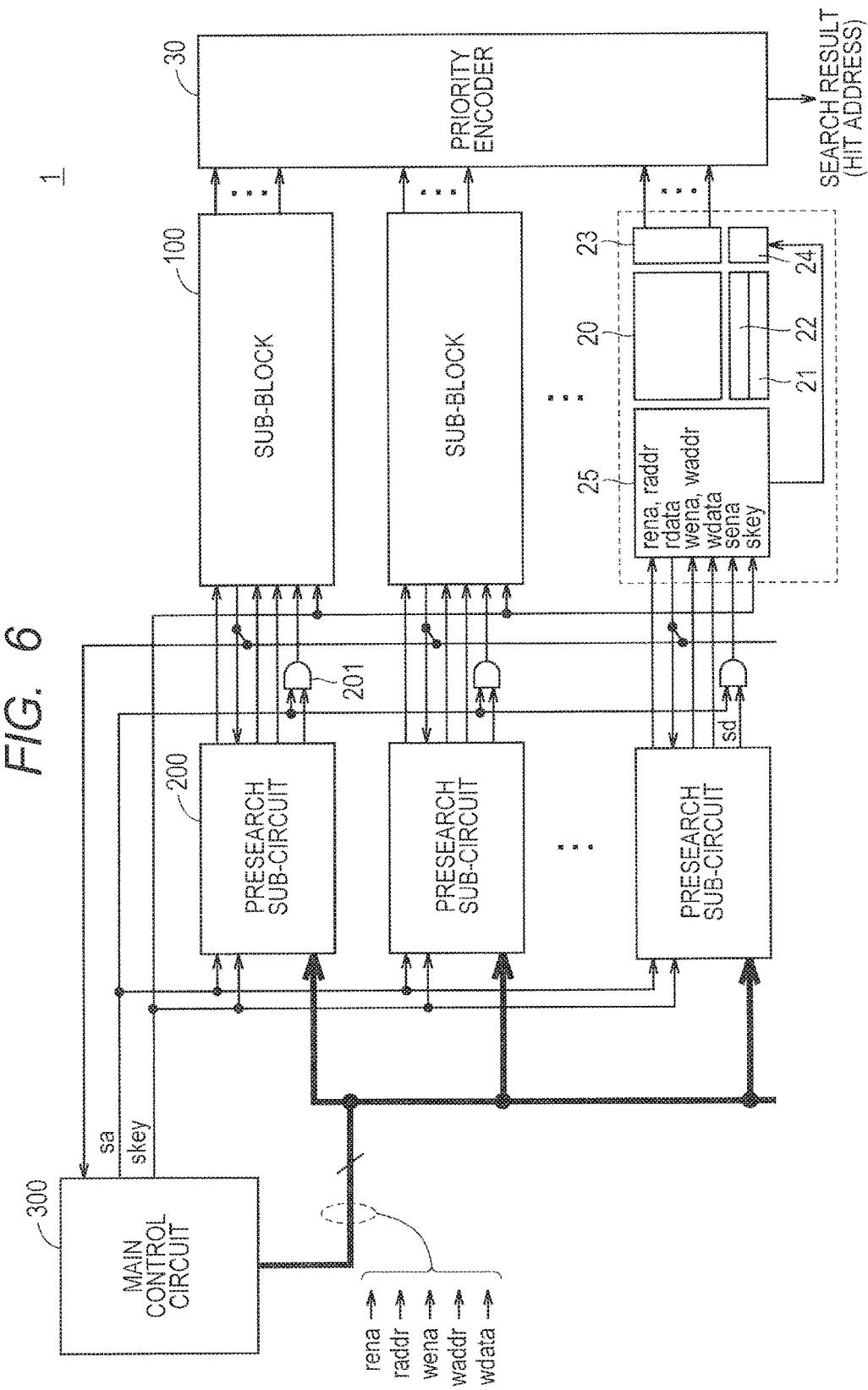
FIG. 6 is a block diagram showing the entire configuration of a search device 1.

FIG. 6 is a block diagram showing the overall configuration of the search device 1.

Referring to FIG. 6, the search device 1 includes a main control circuit 300, a plurality of sub-blocks 100, a priority encoder 30, a plurality of presearch sub-circuits 200, and a plurality of AND circuits 201.

The main control circuit 300 controls the entire search device 1. The sub-block 100 includes the TCAM cell array 20 arranged in rows and columns, the write driver 21, the search line driver 22, the match amplifier unit 23, the control logic circuit 24, and an input/output circuit 25.

The input/output circuit 25 receives input of various control signals, and the like, from the main control circuit 300 and the presearch sub-circuit 200. The input/output circuit 25 outputs the input signals to the control logic circuit 24.

Further, the input/output circuit 25 outputs read data rdata, which is read from the cell array 20, to the main control circuit 300 and the presearch sub-circuit 200. More specifically, the input/output circuit 25 receives input of a read enable signal rena and an address signal raddr from the presearch sub-circuit 200, and outputs to the control logic circuit 24. The control logic circuit 24 performs a data read operation in response to the read enable signal rena and the address signal raddr. Note that the read enable signal rena and the address signal raddr are output to the presearch sub-circuit 200 from the main control circuit 300, and then the signals are output to the sub-block 100 through the presearch sub-circuit 200.

The word line driver starts the corresponding word line in response to the address signal raddr. Then, the word line driver outputs data stored in each memory cell MC to the read circuit through the bit line pair BL, BL_n. The read circuit outputs the read data rdata to the input/output circuit 25.

Further, the input/output circuit 25 receives input of write enable signal wena, write data wdata, and write address signal waddr from the presearch sub circuit 200, and then outputs to the control logic circuit 24. The control logic circuit 24 performs a data write operation in response to the write enable signal wena, the write data wdata, and the write address signal waddr. The write driver 21 drives the bit line pair BL, BL_n based on the write data wdata. Then, the word line driver starts the corresponding word line in response to the write address signal waddr, and writes the data to each memory cell MC in the corresponding memory cell row.

Note that the write enable signal wena, the write address signal waddr, and the write data wdata are output from the main control circuit 300 to the presearch sub-circuit 200, and then they are output to the sub-block 100 through the presearch sub-circuit 200.

Further, the input/output circuit 25 receives input of the search line enable signal sena from the presearch sub-circuit 200 as well as the input search data skey from the main control circuit 300. Then, the input/output circuit 25 outputs the input data to the control logic circuit 24. The control logic circuit 24 performs a data search operation in response to the search line enable signal sena as well as the input search data skeyt from the main control circuit 300. The process of the data search operation is the same as that described above in connection with the search line driver 22 and the match amplifier unit 23.

The priority encoder 30 receives the search results (of whether the input search data and the TCAM data match or not) for each entry from the adjacent sub-block 100. The priority encoder 30 outputs the hit address (the entry address where the TCAM data matching the search data is stored). However, when a plurality of entries hit (match), the priority encoder 30 outputs the address of a high-priority hit entry.

The presearch sub-circuits 200 are provided corresponding to each of the sub-blocks 100.

In each presearch sub-circuit 200, a presearch operation is performed. The AND circuits 201 are provided corresponding to each of the presearch sub-circuits 200. Each AND circuit 201 outputs the search enable signal sena based on the result of the logical AND operation between a search result signal sd of the presearch operation and a search enable signal sa.

Thus, when the "L" level is output as the search result signal sd of the presearch operation of the presearch sub-circuit 200, the search line enable signal sena goes into the inactive state ("L" level) even if the search enable signal sa is the "H" level. Thus, in this case, the data search operation in the corresponding sub-block 100 is not performed.

In this example, the presearch sub-circuit 200 is provided in the previous stage of the sub-block 100. Then, the presearch sub-circuit 200 performs the presearch operation and outputs the search result signal sd.

Based on the search result signal sd, the AND circuit 201 outputs the search line enable signal sena. With respect to the sub-blocks not required to be searched, the search line enable signal sena is set to the inactive state ("L" level) in order to reduce the power consumption in the data search operation.

<B. Configuration of the Presearch Sub-circuit>

[b1. Functional Configuration]

Figure 7:
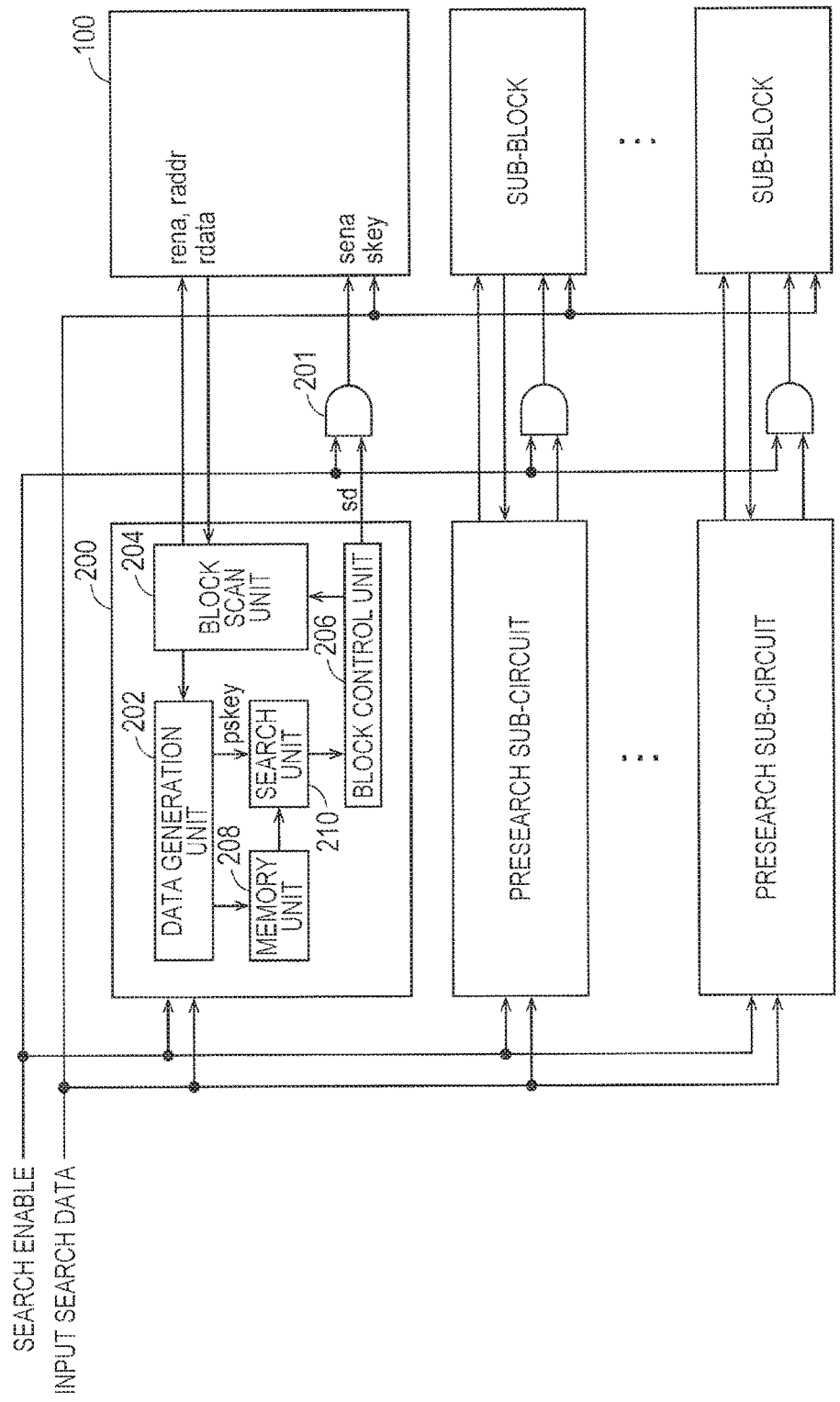
FIG. 7 is a functional block diagram showing the configuration of a presearch sub-circuit 200.

FIG. 7 is a functional block diagram showing the configuration of the presearch sub-circuit 200.

Referring to FIG. 7, the presearch sub-circuit 200 includes a data generation unit 202, a block scan unit 204, a block control unit 206, the memory unit 208, and a search unit 210.

The block control unit 206 outputs various signals to control the sub-block 100. Further, the block control unit 206 instructs the block scan unit 204 to perform a data read operation.

The block scan unit 204 outputs the read enable signal rena and the address signal raddr to the corresponding sub-block 100 according to the instruction from the block control unit 206. The sub-block 100 outputs the read data rdata based on the read enable signal rena and the address signal raddr from the block scan unit 204. The block scan unit 204 outputs the read data rdata from the sub-block 100 to the data generation unit 202.

The data generation unit 202 generates flag data for presearch in order to compare with part of the input search data skey (presearch key pskey) that is input based on the read data rdata from the sub-block 100. The data generation unit 202 outputs the generated flag data to the memory unit 208.

The memory unit 208 stores the flag data generated by the data generation unit 202.

The search unit 210 compares whether the presearch key spkey, which is part of the input search data skey, and the flag data, which is generated by the data generation unit 202 and stored in the memory unit 208, match or not. Then, the search unit 210 outputs the comparison result to the block control unit 206.

The block control unit 206 outputs the comparison result from the search unit 210 to the AND circuit 201 as the search result signal sd.

The AND circuit 201 outputs the search line enable signal sena based on the result of the logical AND operation between the search enable signal sa and the search result signal sd of the presearch operation from the block control unit 206.

The sub-block 100 performs a data search operation on the input search data skey in response to the search line enable signal sena.

Figure 8:
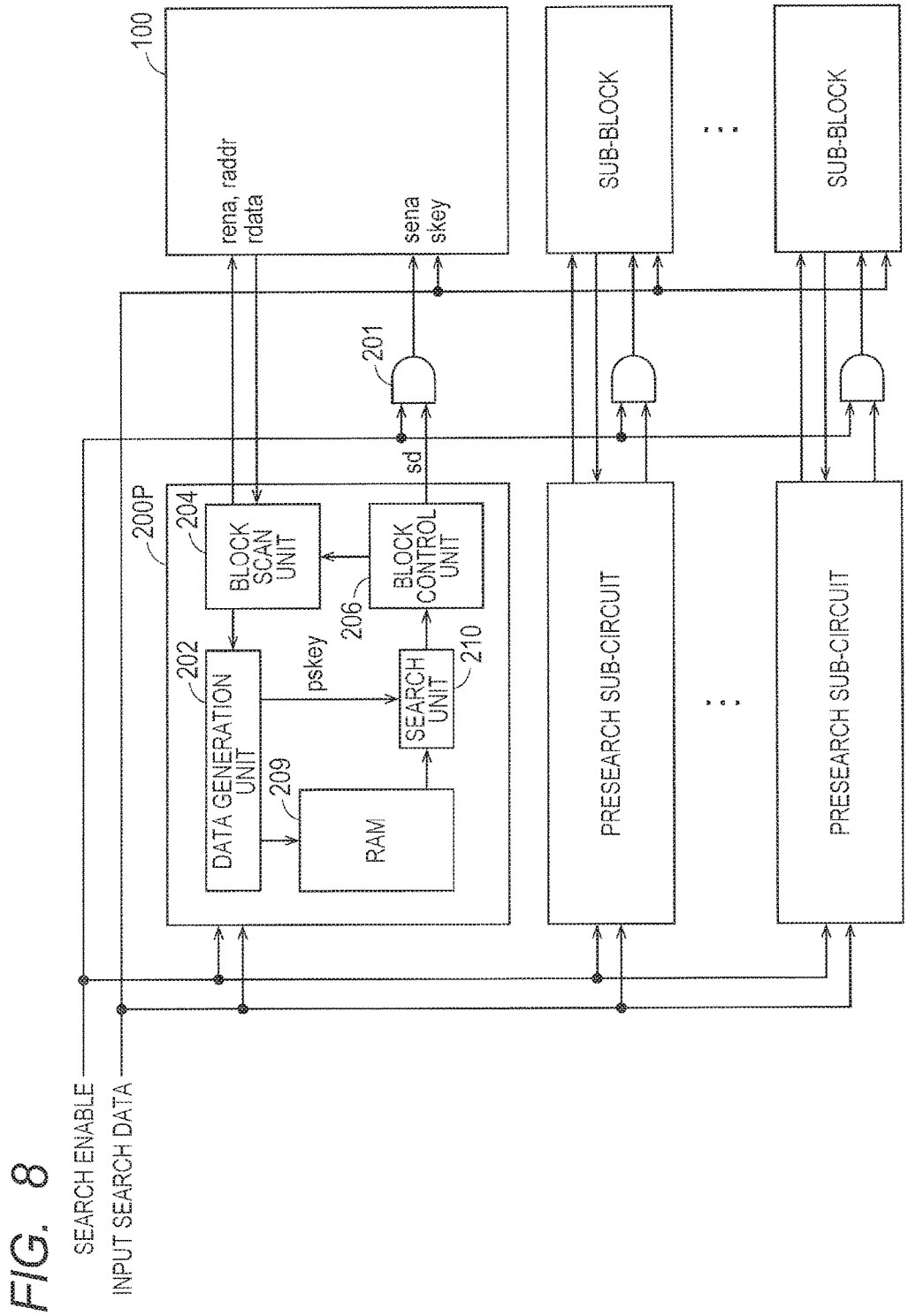
FIG. 8 is another functional block diagram showing the configuration of a presearch sub-circuit 200P.

FIG. 8 is another functional block diagram showing the configuration of a presearch sub-circuit 200P.

Referring to FIG. 8, the presearch sub-circuit 200P is different from the presearch sub-circuit 200 in that the memory unit 208 is replaced by a RAM 209. Other configurations are the same as those described in FIG. 7, so that the detailed description thereof will not be repeated. By configuring the memory unit 208 with a random access memory (RAM), the power consumption can be reduced and the area of the memory unit 208 can also be reduced.

Figure 9:
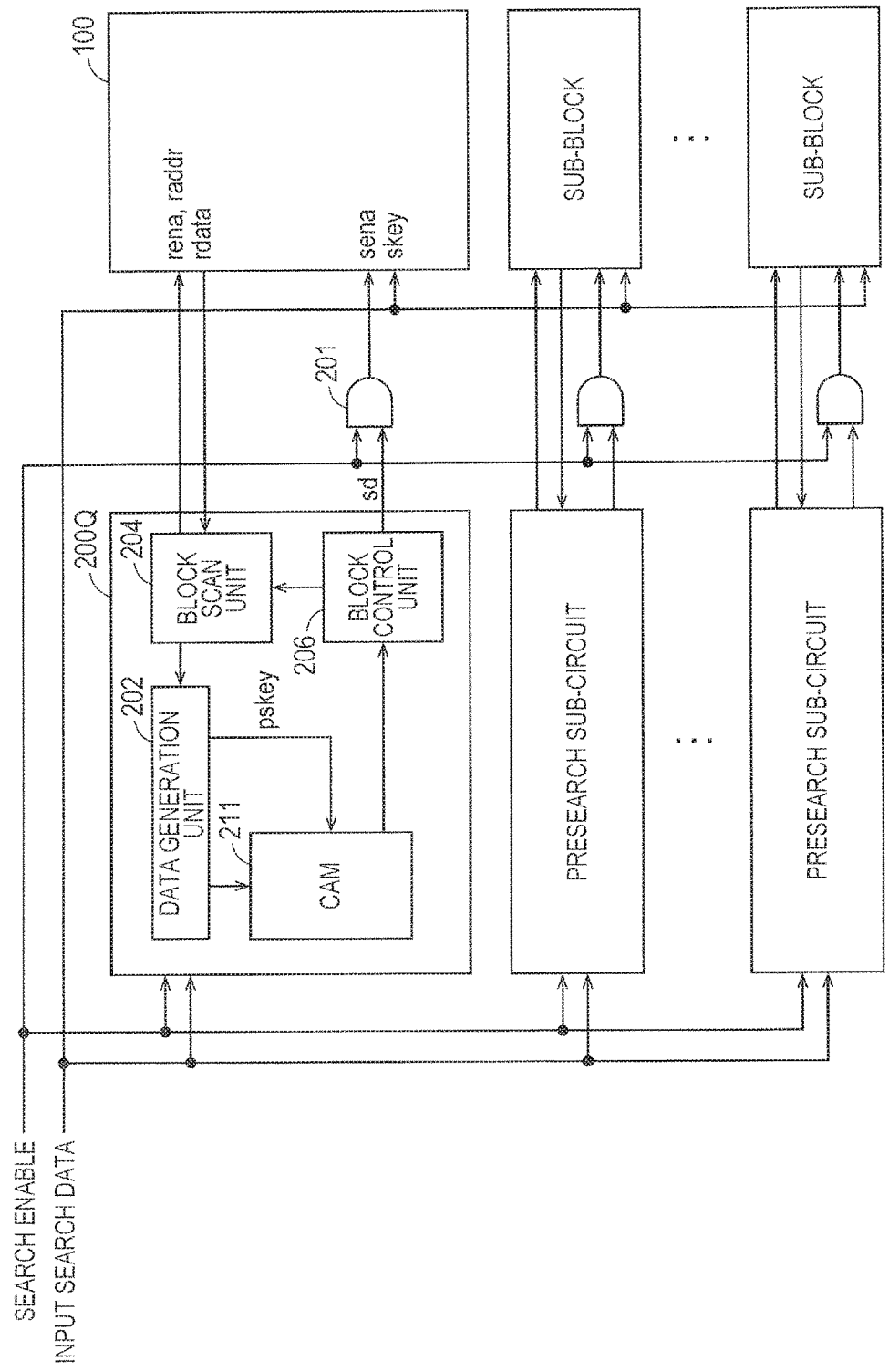
FIG. 9 is still another functional block diagram showing the configuration of a presearch sub-circuit 200Q.

FIG. 9 is still another functional block diagram showing the configuration of a presearch sub-circuit 200Q.

Referring to FIG. 9, the presearch sub-circuit 200Q is different from the presearch sub-circuit 200 in that a CAM 200 is provided in place of the memory unit 208 and the search unit 210. Other configurations are the same as those described in FIG. 7, and the detailed description thereof will not be repeated. By configuring the memory unit 208 and the search unit 210 with a content addressable memory (CAM), the memory unit 208 and the search unit 210 can be achieved with a simple configuration.

Figure 10:
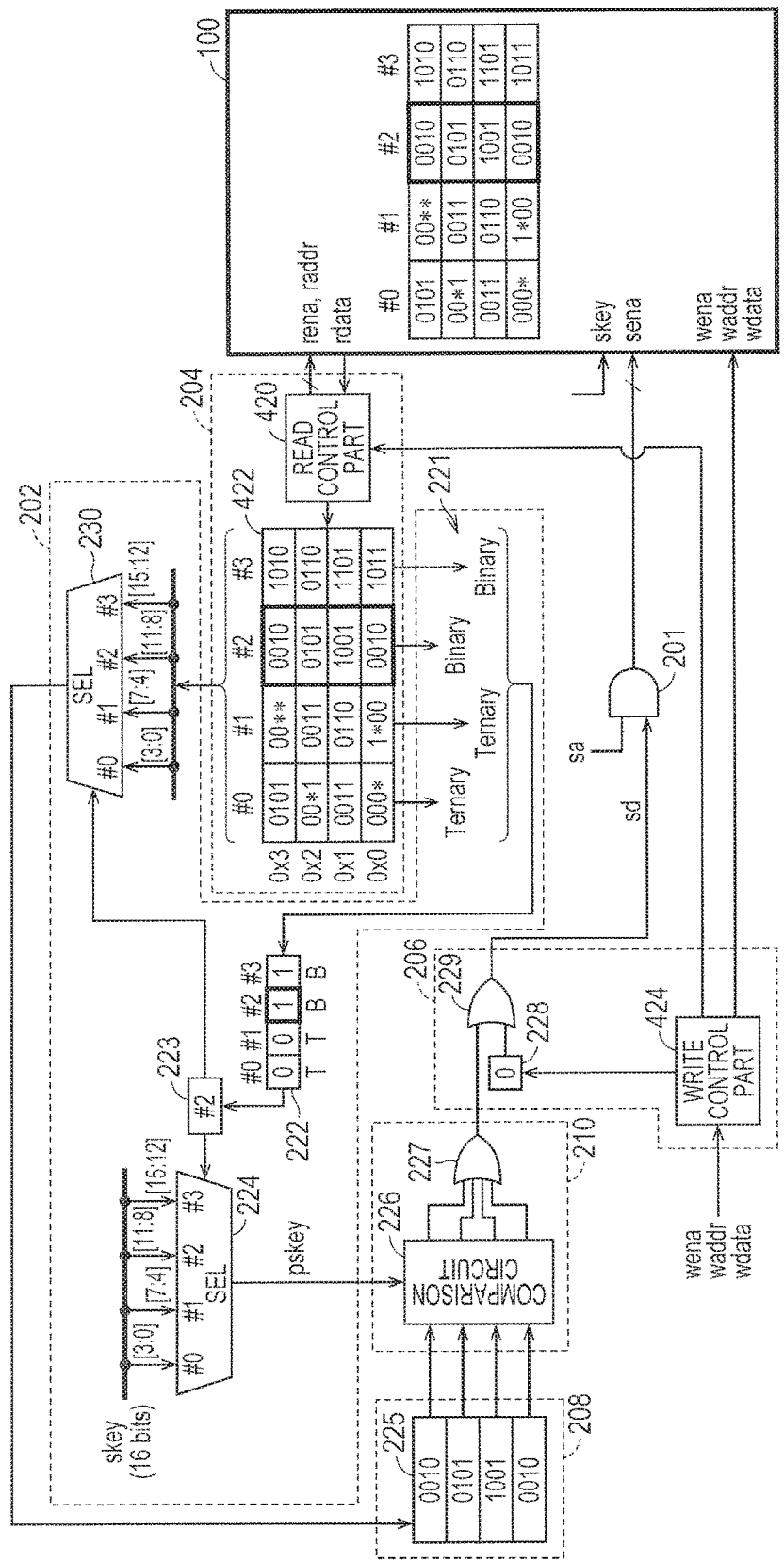
FIG. 10 is a diagram showing the outline of the operation of the presearch sub-circuit 200.

FIG. 10 is a diagram showing the outline of the operation of the presearch sub-circuit 200.

Referring to FIG. 10, the presearch sub-circuit 200 includes the data generation unit 202, the block scan unit 204, the block control unit 206, the memory unit 208, and the search unit 210.

The block scan unit 204 performs a data read operation on the corresponding sub-block 100. This example shows the configuration of the TCAM cell data read by the block scan unit 204.

The block scan unit 204 includes a read control part 420 that performs a data read operation on the corresponding sub-block 100, and a temporary storage part 422 that stores the read data.

The read control part 420 instructs the sub-block 100 to perform a data read operation in response to the read enable signal rena and the address signal raddr. The sub-block 100 performs the data read operation according to the instruction from the read control part 420, and outputs the read data rdata to the read control part 420.

In this example, in order to simplify the description, a case in which four entries (rows) are stored in the temporary storage part 422 as TCAM cell data of the sub-block 100, in which each entry (row) contains 16-bit data, is described as an example.

Further, it is shown that each entry (row) is divided by a predetermined number of rows. In this example, a case in which each entry (row) is divided by four bits is described as an example. Then, an identifier #0 is assigned to the 0th to third areas. Further, an identifier #1 is assigned to the fourth to seventh areas. Further, an identifier #2 is assigned to the eighth to eleventh areas. Then, an identifier #3 is assigned to the twelfth to fifteenth areas.

The figure shows a case in which the data of "000*1*0000101011" is stored in the first entry (row). Further, the figure shows a case in which the data of "0011011010011101" is stored in the second entry (row), the data of "00*1001101010110" is stored in the third entry (row), and the data of "010100**00101010" is stored in the fourth entry (row). Addresses are assigned to the respective entries (rows). The 0th area ("0×1") corresponds to the second entry (row). The second area ("0×2") corresponds to the third entry (row). Then, the third area ("0×3") corresponds to the fourth entry (row).

The data generation unit 202 includes a data determination unit 221, a determination register 222, a selection register 223, and selectors 224 and 230.

The data determination unit 221 determines whether all data in a predetermined area is binary or not, based on the read data rdata from the corresponding sub-block 100 that is stored in the temporary storage part 422.

The data determination unit 221 determines whether all data in areas corresponding to the identifiers #0 to #3 of four rows each are binary or not. In this example, the area corresponding to the identifier #0 includes "*", so that all data is not binary valued. Thus, it is determined that the data is "Ternary". The area corresponding to the identifier #1 includes "*", so that all data is not binary valued. Thus, it is determined that the data is "Ternary". The area corresponding to the identifier #2 does not include "*", so that all data is binary valued. Thus, it is determined that the data is "Binary". Further, the area corresponding to the identifier #3 does not include "*", so that all data is binary valued. Thus, it is determined that the data is "Binary".

The data determination unit 221 stores the determination results for each area into the determination register 222. The determination register 222 stores "1" when it is determined that the data is "Binary", and stores "0" when it is determined that the data is "Ternary".

The selection register 223 stores data that specifies the smallest identifier, based on the determination value ("1") stored in the determination register 222. In this example, the selection register 223 stores "#2".

The selector 230 selects flag data based on the data stored in the selection register 223. In this example, the selector 230 selects the data of the area corresponding to the entry (row), as flag data, based on the data (identifier #2) stored in the selection register 223. In this example, of the entries (rows), the eighth to eleventh data are specified based on the data ("#2") stored in the selection register 223. Note that the symbol [p:0] indicates that the 0th to p-th data are specified. Thus, [11:8] indicates that the eighth to eleventh data are specified. The same is true for other examples.

The selector 230 selects "0010", "1001", "0101", and "0010" as flag data with respect to the 0th to third entries (rows). The selected flag data are output to the memory unit 208.

The memory unit 208 includes a flag data register 225. The flag data register 225 stores flag data used as comparison results. In this example, the data of each entry (row) corresponding to the identifier #2 is stored as the flag data based on the data ("#2") stored in the selection register 223. As an example, the figure shows a case in which "0010", "1001", "0101", and "0010" are stored as flag data in the flag data register 225.

The selector 224 specifies the data (presearch key pskey) which is part of the input search data skey that is input according to the data of the selection register 223.

In this example, of the input search data skey, the eighth to eleventh data are specified as the presearch key pskey based on the data ("#2") stored in the selection register 223. In this way, the partial data of the input search data, which is located at the same position as that corresponding to the partial data of the entry (row), is specified.

The search unit 210 includes a comparison circuit 226 and an OR circuit 227.

The comparison circuit 226 compares the partial data of the input search data skey selected by the selector 230 with each of the flag data stored in the flag data register 225. Then, the comparison circuit 226 outputs the comparison results to the OR circuit 227. In this example, the comparison circuit 226 outputs the "H" level when the data match, and outputs the "L" level when the data do not match.

The OR circuit 227 outputs the logical OR operation result of the comparison results from the comparison circuit 226, to the block control unit 206.

The block control unit 206 includes a valid/invalid register 228, an OR circuit 229, and a write control part 424.

The write control part 424 performs a data write operation on the corresponding sub-block 100.

The write control part 424 instructs the sub-block 100 to perform a data write operation in response to a write enable signal wena, a write address signal waddr, and a write data wdata.

The write control part 424 controls the value of the valid/invalid register 228. Further the write control part 424 instructs the read control part 420 to perform a data read operation.

The valid/invalid register 228 is a register for setting the presearch operation of the presearch sub-circuit 200 to valid/invalid. When the presearch operation of the presearch sub-circuit 200 is set to valid, the value of the register is set to "0". On the other hand, when the presearch operation of the presearch sub-circuit 200 is set to invalid, the value of the register is set to "1".

The OR circuit 229 outputs a search result signal sd of the presearch operation, based on the output signal from the search unit 210 as well as the register value of the valid/invalid register 228.

The AND circuit 201 outputs the result of the logical AND operation between the search enable single sa and the search result signal sd of the presearch operation of the presearch sub-circuit 200, as the search line enable signal sena.

For example, when the data match as a comparison result of the comparison circuit 226, the search result signal sd ("1") of the presearch operation of the presearch sub-circuit 200 is output. In this case, the search line enable signal sena is set to the active state ("H" level) in response to the search enable signal sa ("H" level). Thus, the data search operation is performed on the corresponding sub-block 100.

On the other hand, when the data do not match as a comparison result of the comparison circuit 226, the search result signal sd ("0") of the presearch operation of the presearch sub-circuit 200 is output. In this case, the search line enable signal sena is set to the inactive state ("L" level) even if the search enable signal sa ("H" level) is input. Thus, the data search operation is not performed on the corresponding sub-block 100.

Further, when the value of the register of the valid/invalid register 228 is "1", the search result signal sd ("1") of the presearch operation of the presearch sub-circuit 200 is output regardless of the comparison result of the comparison circuit 226. In this case, the search line enable signal sena is set to the active state ("H" level) in response to the search enable signal sa ("H" level). Thus, the data search operation is performed on the corresponding sub-block 100.

In this way, the presearch sub-circuit 200 generates flag data for presearch in order to compare with part of the input search data, based on the data of the entry (row) stored in the corresponding sub-block. At this time, when the register value of the valid/invalid register 228 is "0", the presearch sub-circuit 200 compares part of the input search data with the flag data. When the data match, the presearch sub-circuit 200 outputs the search result signal sd ("1") of the presearch operation. When the data do not match, the presearch sub-circuit 200 outputs the search result signal sd ("0") of the presearch operation. Thus, when the search result signal sd ("0") of the presearch operation is output, the data search operation of the corresponding sub-block 100 is not performed. In this way, it is possible to achieve low power consumption by stopping the operation of the sub-block for which the data search operation is not required.

[b3. Reset Operation of the Presearch Sub-circuit]

Figure 11:
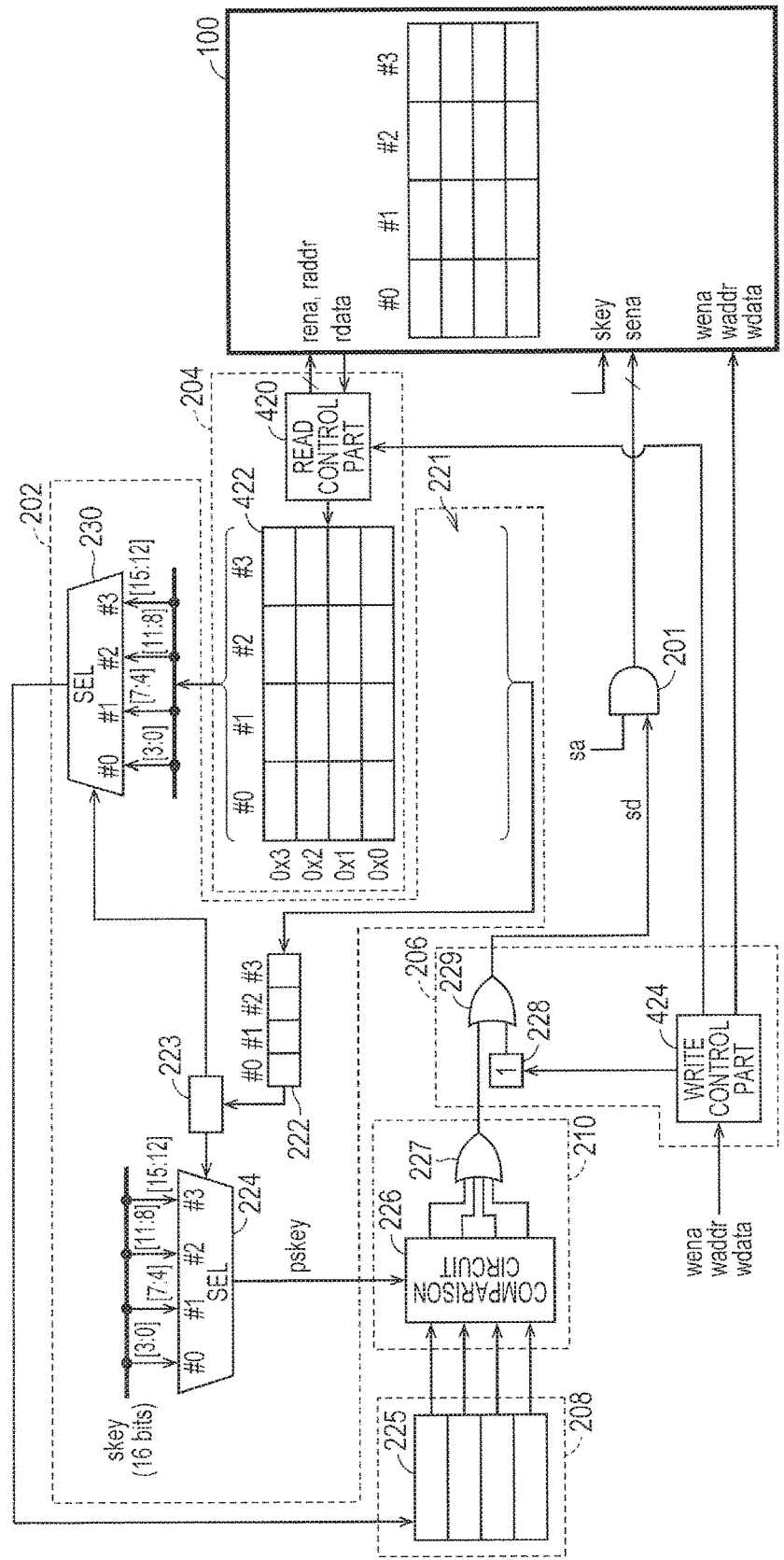
FIG. 11 is a diagram showing the outline of the operation of the presearch sub-circuit 200 in the reset state or in the initialization state.

FIG. 11 is a diagram showing the outline of the operation of the presearch sub-circuit 200 in the reset state or in the initialization state.

Referring to FIG. 11, the register value of the valid/invalid register 228 is "1" compared with the configuration of FIG. 10. This example shows a case in which the data of the entry (row) is not stored in the corresponding sub-block 100. In the reset state of in the initialization state of the search device, the register value of the valid/invalid register 228 is set to "1".

Thus, the presearch operation in the presearch sub-circuit 200 is made invalid.

When the register value of the valid/invalid register 228 is "1", the presearch sub-circuit 200 operates as a flag data generation mode. On the other hand, when the register value of the valid/invalid register 228 is "0", the presearch sub-circuit 200 performs a presearch operation as a normal mode.

[b4. Flag Data Generation of the Presearch Sub-circuit]

Figure 12:
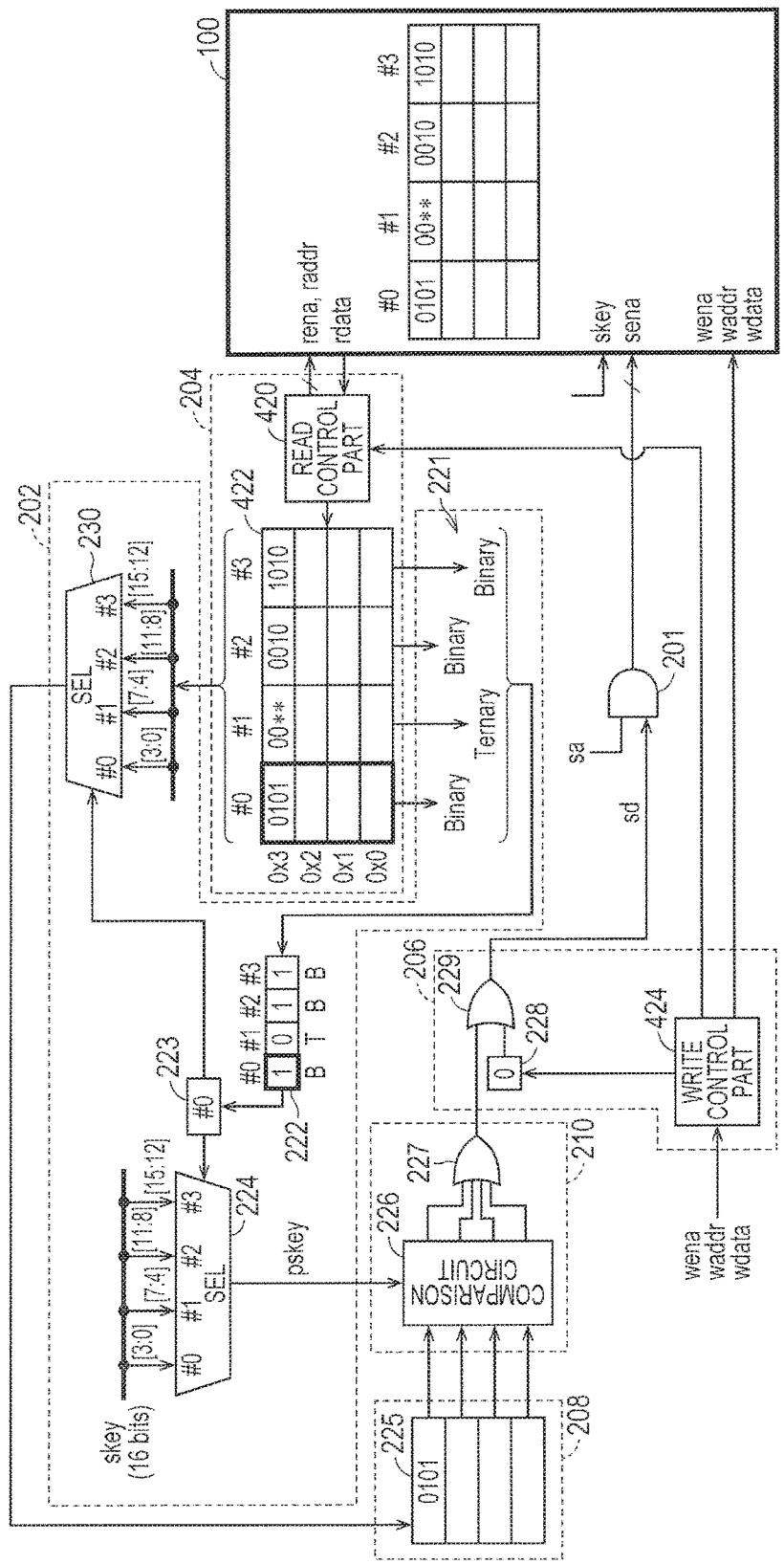
FIG. 12 is a diagram showing an example of the operation of the presearch sub-circuit 200 in flag data generation mode.

FIG. 12 is a diagram showing an example of the operation of the presearch sub-circuit 200 in the flag data generation mode.

Referring to FIG. 12, the write control part 424 instructs the sub-block 100 to perform a data write operation in response to the write enable signal wena, the write address signal waddr, and the write data wdata. This example shows a case in which the initial data ("01010000101010") is stored in the entry (row) with respect to the corresponding sub-block 100**.

In order to instruct the sub-block 100 to perform the data write operation, the write control part 424 sets the register value of the valid/invalid register 228 to "1". In this way, the presearch operation is made invalid.

The block scan unit 204 reads the data stored in the sub-block 100, in the flag data generation mode, according to the instruction from the write control part 424. More specifically, in response to the read enable signal rena and the address signal raddr, the read control part 420 instructs the sub-block 100 to perform a data read operation. The sub-block 100 performs the data read operation according to the instruction from the read control part 420, and outputs the read data rdata to the read control part 420. The read control part 420 stores the read data rdta in the temporary storage part 422.

When the data is stored in a plurality of entries (rows), the block scan unit 204 read the data of the entries (rows) corresponding to the addresses in ascending order, from start to end.

The data determination unit 221 determines whether all data in a predetermined area is binary, according to the read data radta stored in the temporary storage part 422.

In this example, the area corresponding to the identifier #0 does not include "*", so that all data is binary valued. Thus, it is determined that the data is "Binary". The area corresponding to the identifier #1 includes "*", so that all data is not binary valued. Thus, it is determined that the data is "Ternary". Further, the area corresponding to the identifier #2 does not include "*", so that all data is binary valued. Thus, it is determined that the data is "Binary".

The data determination unit 221 stores the determination results for each area into the determination register 222. In this example, "1011" is stored.

The selection register 223 stores data that specifies the smallest identifier based on the determination value ("1") stored in the determination register 222. This example shows a case in which the selection register 223 stores "#0".

The flag data register 225 stores the data of the area corresponding to the identifier #1 as flag data, based on the data ("#1") stored in the selection register 223. As an example, "0101" is stored as flag data in the flag data register 225.

Then, after the data is stored in the flag data register 225, the write control part 424 updates the register value of the valid/invalid register 228. In this example, the register value of the valid/invalid register 228 is updated to "0". In this way, the presearch operation in the presearch sub-circuit 200 is made valid.

In the normal mode, the 0th to third data of the input search data skey are specified as the presearch key pskey, based on the data ("#0") stored in the selection register 223.

The comparison circuit 226 compares the presearch key pskey, which is the partial data of the input search data skey selected by the selector 230, with each of the flag data stored in the flag data register 224. Then, the comparison circuit 226 outputs the comparison results to the OR circuit 227. In this example, the comparison circuit 226 outputs the "H" level when the data match, and outputs the "L" level when the data do not match.

For example, when the data match as a comparison result of the comparison circuit 226, the search result signal sd ("1") of the presearch operation of the presearch sub-circuit 200 is output. In this case, the search line enable signal sena is set to the active state ("H" level), in response to the search enable signal sa ("H" level). Thus, the data search operation is performed on the corresponding sub-block 100.

Then, each time an entry (row) is added and stored in the corresponding sub-block 100, the presearch sub-circuit 200 repeatedly performs the above process, and then transits to the state described in FIG. 10.

[b5. Update of Flag Data in the Presearch Sub-circuit]

Figure 13:
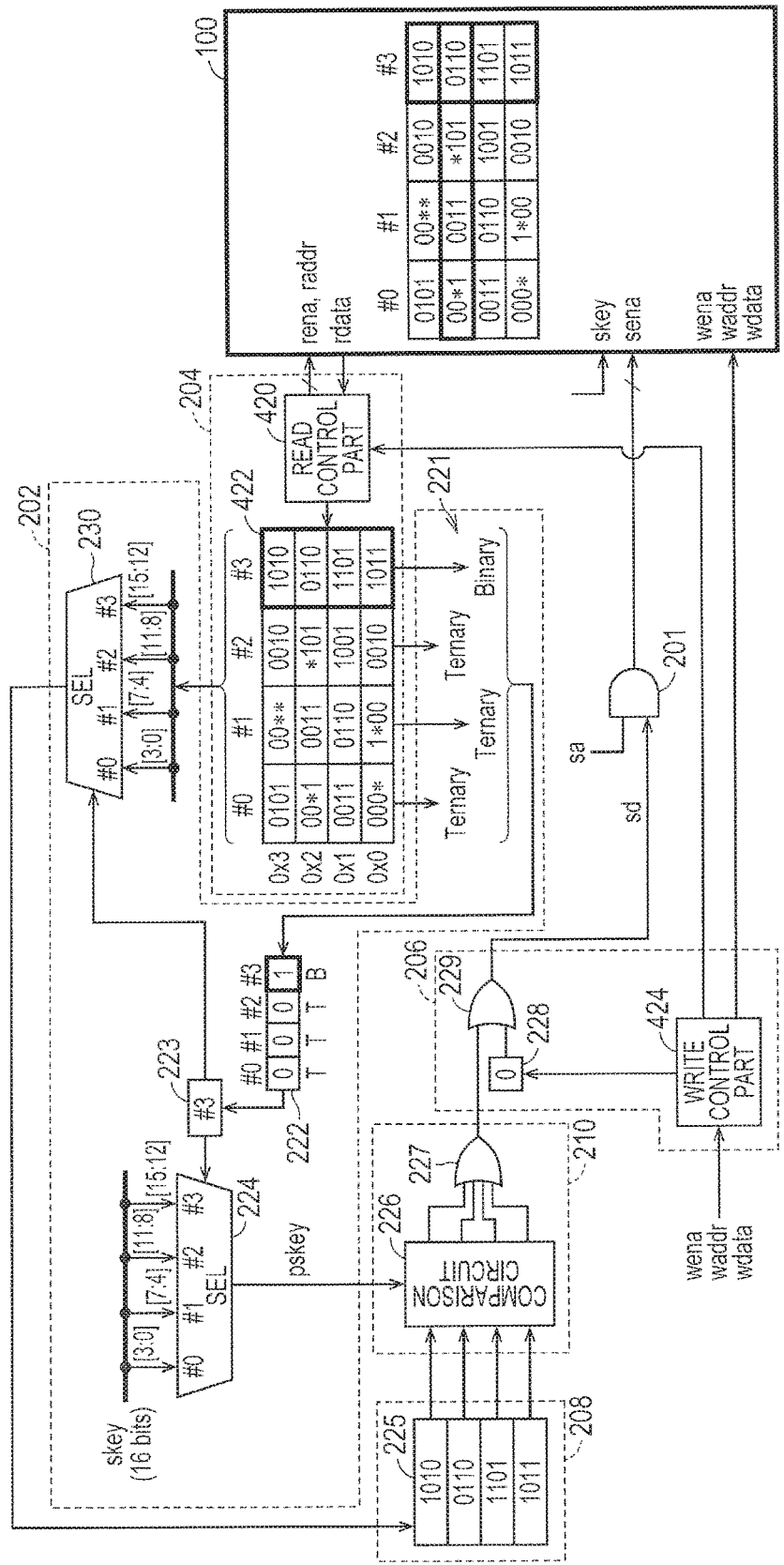
FIG. 13 is a diagram showing an update of the flag data of the presearch sub-circuit 200.

FIG. 13 is a diagram showing the update of flag data of the presearch sub-circuit 200.

Referring to FIG. 13, in response to the write enable signal wena, the write address signal waddr, and the write data wdata, the write control part 424 instructs the sub-block 100 to perform a data write operation. This example shows a case in which the data ("00*1001101010110") in the state shown in FIG. 10 is updated to ("00*10011*1010110") in the entry (row) with respect to the corresponding sub-block 100.

The write control part 424 sets the register value of the valid/invalid register 228 to "1". In this way, the presearch operation is made invalid.

Then, as described above, the block scan unit 204 reads the data stored in the sub block 100, in the flag data generation mode, according to the instruction from the write control part 424. More specifically, the sub-block 100 performs a data read operation according to the instruction from the read control part 420. Then, the sub-block 100 outputs the read data rdata to the read control part 420. The read control part 420 stores the read data rdata in the temporary storage part 442.

The data determination unit 221 determines whether all data in a predetermined area are binary, based on the read data rdata stored in the temporary storage part 422.

In this example, the areas corresponding to the identifiers #0, #1, and #2 include "*", so that all data is not binary valued. Thus, it is determined that the data is "Ternary". The area corresponding to the identifier #3 does not include "*", so that all data is binary valued. Thus, it is determined that the data is "Binary".

The data determination unit 221 stores the determination results for each area into the determination register 222. In this example, the value of the determination register 222 is updated from "0011" to "0001".

The selection register 223 stores the data that specifies the smallest identifier based on the determination value ("1") stored in the determination register 222. This example shows a case in which "#3" is stored in the selection register 223.

The flag data register 225 stores the data of the area corresponding to the identifier #3 as flag data, based on the data ("#3") stored in the selection register 223. As an example, "1010", "0110", "1101", and "1011" are stored, as flag data, into the flag data register 225.

Then, after the data is stored in the flag data register 225, the write control part 424 updates the register value of the valid/invalid register 228. In this example, the register value of the valid/invalid register 228 is updated to "0". In this way, the presearch operation in the presearch sub-circuit 200 is made valid.

In the normal mode, the twelfth to fifteenth data of the input search data skey are specified based on the data ("#3") stored in the selection register 223.

The comparison circuit 226 compares the partial data of the input search data skey selected by the selector 230, with each of the flag data stored in the flag data register 225. Then, the comparison circuit 226 outputs the comparison results to the OR circuit 227. In this example, the comparison circuit 226 outputs the "H" level when the data match, and outputs the "L" level when the data do not match.

For example, when the data match as a comparison result of the comparison circuit 226, the search result signal sd ("1") of the presearch operation of the presearch sub-circuit 200 is output. In this case, the search line enable signal sena is set to the active state ("H" level) in response to the search enable signal sa ("H" level). Thus, the data search operation is performed on the corresponding sub-block 100.

With this method, when the data of the entry (row) is updated with respect to the sub-block 100, it is possible to continue the presearch operation by updating the flag data of the presearch sub-circuit 200.

The flag data can also be updated automatically in the background.

Note that the above example describes the method of extracting data in the unit of 4 bits as flag data. However, the flag data is not particularly limited to 4 bits and the number of bits can be changed variably. Also, the boundary position of the area can be changed to an arbitrary position. Further, it is possible to perform an encoding process on the read data or perform a data compression process by using a hash function, to generate flag data based on the compressed data. It is also possible to generate flag data based on the data obtained by performing a filtering process, such as a bloom filter, on the read data.

Variation 1

[b6. Another Update Example of Flag Data in the Presearch Sub-circuit]

Figure 14:
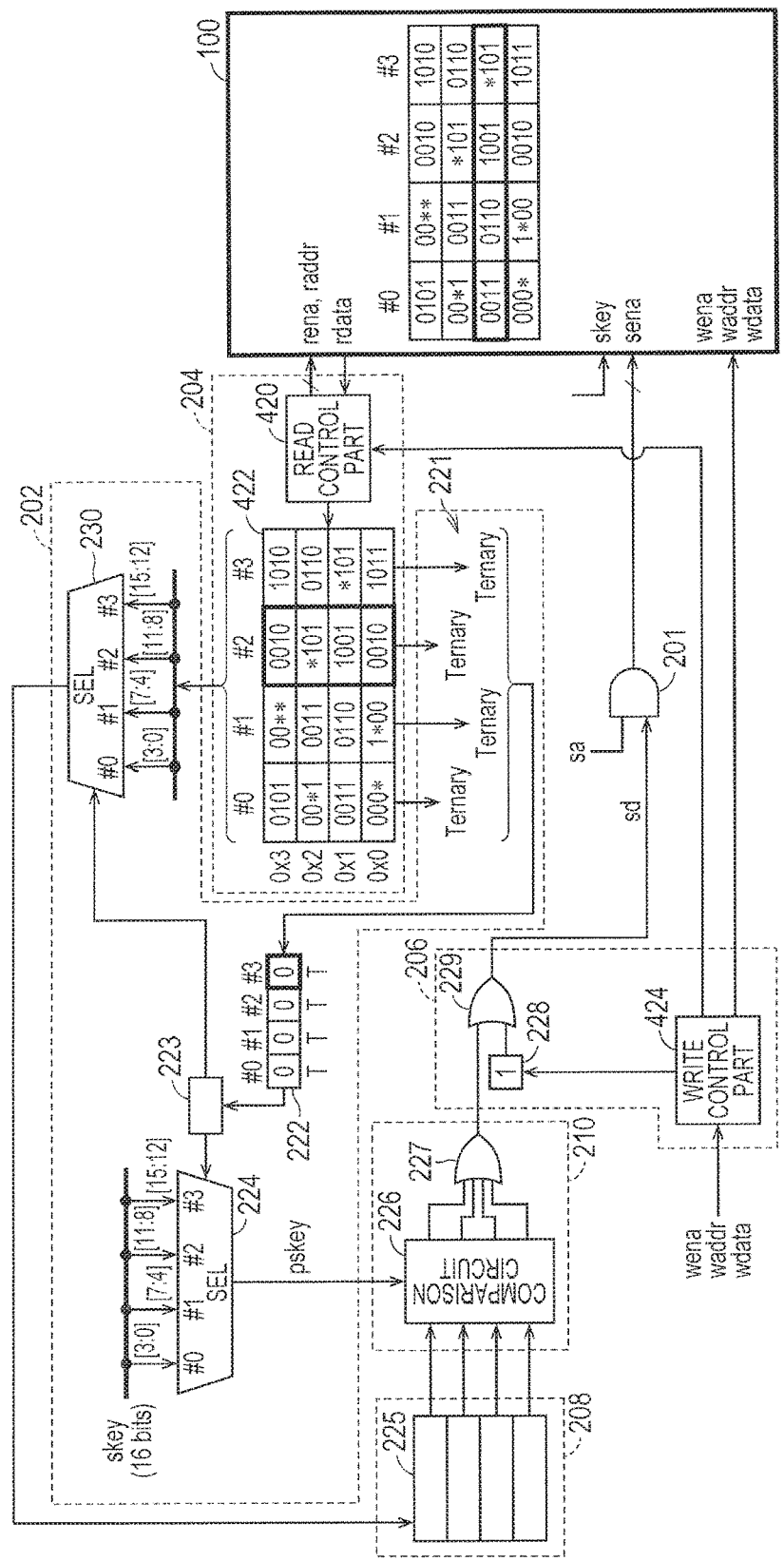
FIG. 14 is a diagram showing another update of the flag data of the presearch sub-circuit 200.

FIG. 14 is a diagram showing another update of flag data in the presearch sub-circuit 200.

Referring to FIG. 14, in response to the write enable signal wena, the write address signal waddr, and the write data wdata, the write control part 424 instructs the sub-block 100 to perform a data write operation,. This example shows a case in which the data ("0011011010011101") in the state shown in FIG. 13 is updated to ("001101101001*101") in the entry (row) with respect to the corresponding sub-block 100.

The write control part 424 sets the register value of the valid/invalid register 228 to "1". In this way, the presearch operation is made invalid.

Then, as described above, the block scan unit 204 reads the data stored in the sub-block 100, in the flag data generation mode, according to the instruction from the write control part 424. More specifically, the sub-block 100 performs the data read operation according to the instruction from the read control part 420. Then, the sub-block 100 outputs the read data rdata to the read control part 420. The read control part 420 stores the read data rdata in the temporary storage part 422.

The data determination unit 221 determines whether all data in a predetermined area is binary, based on the read data rdata stored in the temporary storage part 422.

In this example, "*" is included in the areas corresponding to the identifiers #0, #1, #2, and #3, so that all data is not binary valued. Thus, it is determined that the data is "Ternary".

The data determination unit 221 stores the determination results for each area into the determination register 222. In this example, the value of the determination register 222 is updated from "0001" to "0000".

The selection register 223 stores the data that specifies the smallest identifier based on the determination value stored in the determination register 222. This example shows a case in which the selection register 223 is blank because the determination values are all "0".

In accordance with this, the data stored in the selection register 223 is blank, so that the flag data stored in the flag data register 225 is also blank, thus preventing the presearch operation from being performed.

In this example, when the determination values stored in the determination register 222 are all "0", the presearch sub-circuit 200 performs a re-determination process by changing the determination target in the data determination unit 221.

Figure 15:
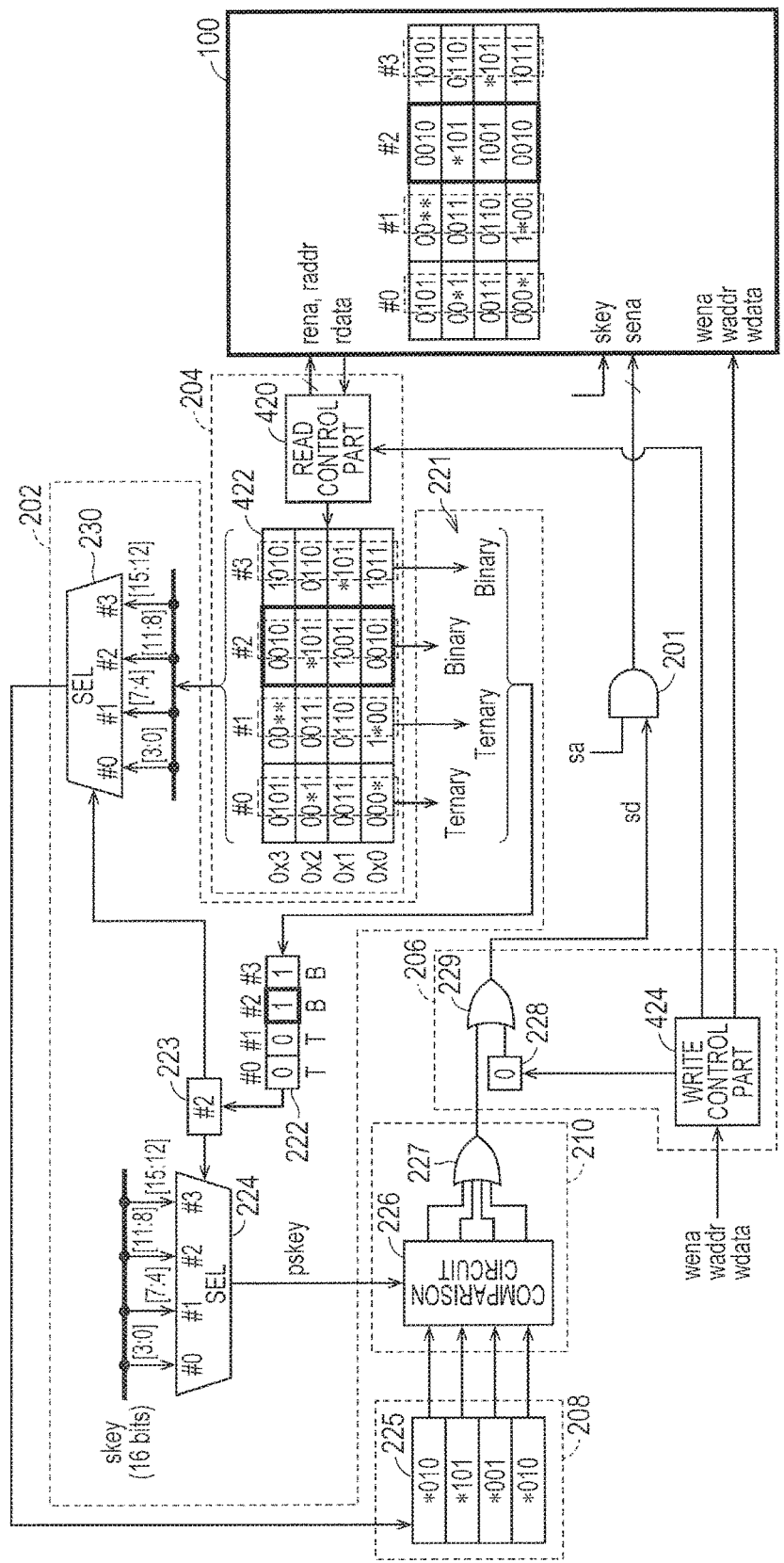
FIG. 15 is a diagram showing a change in the determination target of the presearch sub-circuit 200.

FIG. 15 is a diagram showing the change in the determination target of the presearch sub-circuit 200.

As shown in FIG. 15, when it is determined that the data is "Ternary" for all of the areas, the data determination unit 221 masks the first bit of the 4 bits in each area, and determines whether the data in the remaining 3 bits in the area are all binary.

In this example, the data determination unit 221 determines whether "*" is included in the areas corresponding to 3 bits for each of the identifiers #0, #1, and #3.

In this case, "*" is included in the areas corresponding the identifiers #0 and #1 with respect to 3 bits, so that all data is not binary valued. Thus, it is determined that the data is "Ternary".

On the other hand, "*" is not included in the areas corresponding the identifiers "2 and "3 with respect to 3 bits, so that all data is binary valued. Thus, it is determined that the data is "Binary".

The data determination unit 221 stores the determination results for each area into the determination register 222. In this example, the value of the determination register 222 is updated from "0000" to "0011".

Thus, the selection register 223 stores the data that specifies the smallest identifier based on the determination value ("1") stored in the determination register 222. This example shows a case in which the selection register 223 stores "#2".

The flag data register 225 stores the data of the area corresponding to the identifier #2, as flag data, based on the data ("2") stored in the selection register 223. At this time, the first bit is excluded, so that "*" is set to the first bit and "*010", "*101", "*001", and "*010" are stored as flag data into the flag data register 225.

Then, after the data is stored in the flag data register 225, the write control part 424 updates the register value of the valid/invalid register 228. In this example, the register value of the valid/invalid register 228 is updated to "0". In this way, the presearch operation in the presearch sub-circuit 200 is made valid.

In the normal mode, the eighth to eleventh data of the input search data skey are specified as the presearch key, based on the data ("2") stored in the selection register 223.

The comparison circuit 226 compares the presearch key, which is the partial data of the input search data skey selected by the selector 230, with each of the flag data stored in the flag data register 225. Then, the comparison circuit 226 outputs the comparison results to the OR circuit 227. The comparison circuit 226 outputs the "H" level when the data match, and outputs the "L" level when the data do not match.

For example, when the data match as a comparison result of the comparison circuit 226, the search result signal sd ("1") of the presearch operation of the presearch sub-circuit 200 is output. In this case, the search line enable signal sena is set to the active state ("H" level)" in response to the search enable signal sa ("H" level). Thus, the data search operation is performed on the corresponding sub-block 100.

In this way, when the data of the entry (row) is updated with respect to the sub-block 100, even if the determination values of the determination register 222 are all "0", it is possible to continue the presearch operation by changing the determination target.

In this example, 1 bit is masked to generate the flag data in the unit of 3 bits. Compared to the case of 4 bits, the ability to express the characteristics of the continuous bit string is reduced, but it is possible to maintain the configuration of the presearch sub-circuit 200 for low power consumption.

In this example, it is assumed that the number of bits is reduced from 4 bits. However, the method of 4 bits may be maintained because an area that was unusable as flag sometimes becomes usable. For example, the part in which the original data is "*" (Ternary) value can actually be rewritten to a binary value. In this case, it is also possible to maintain a method of reproducing only the flag while continuing the 4-bit selection method.

Note that this example describes a case in which the first 1 bit of the 4 bits is masked. However, the position of the bit to be masked is not particularly restricted to the first bit, and any other position can be masked. In addition, the number of bits to be masked is not limited to one, and a plurality of bits can also be masked.

Variation 2

The above example describes the method of performing data determination by reading all data each time the data of the entry (row) is updated. However, it takes time to read all of the data. Thus, in order to prevent the reduction in performance, it is possible to perform a maintenance operation to update the flag data by reading all data after the data of the entry (row) is updated several times.

<C. Variation of the Maintenance Operation>

[c1. Another Configuration of the Maintenance Operation]

Figure 16:
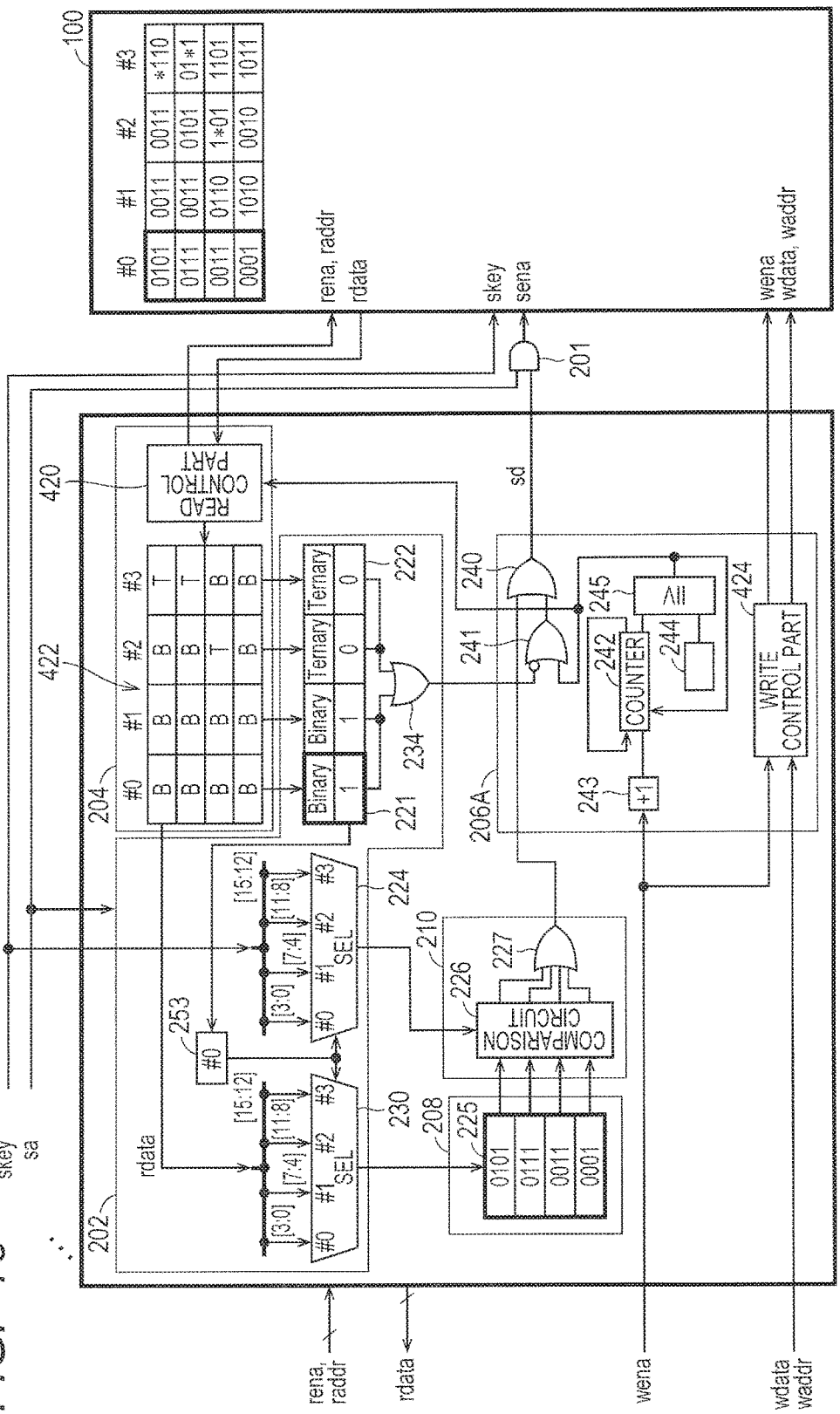
FIG. 16 is a diagram showing the configuration of the presearch sub-circuit according to a second variation.

FIG. 16 is a diagram showing the configuration of a presearch sub-circuit according to the second variation.

Referring to FIG. 16, the difference is that the block control unit 206 is replaced by a block control unit 206A.

Compared with the block control unit 206, the block control unit 206A further includes OR circuits 240 and 241, a counter 242, a trigger generation circuit 243, a register 244, and a comparison circuit 245.

The trigger generation circuit 243 generates a trigger signal in response to input of write enable signal wena.

The trigger signal generated by the trigger generation circuit 243 is output to the counter 242.

The counter 242 counts up based on the input of the trigger signal, and holds the counter value. Thus, the counter 242 counts up in response to input of write enable signal wena, it is possible to count the number of writs.

The comparison circuit 245 compares the counter value of the counter 242 with the value of the register 244, and outputs the comparison result. The register 244 stores the reference value, which is the comparison target of the comparison circuit 245. In this example, it is assumed as an example that "8" is included.

The counter 242 counts up until the counter value of the counter 242 reaches 8 in response to the write enable signal wena. When the counter value reaches 8, the comparison circuit 245 outputs the "H" level. Further, when the counter value reaches 8, the counter 242 is reset to the initial value 0.

The OR circuit 241 outputs the inverted signal of the OR circuit 234 as well as the result of logical OR operation of the signal from the comparator circuit 245, to the OR circuit 240.

The OR circuit 240 outputs the result of the logical OR operation between the search result of the search unit 210 and the output signal of the OR circuit 240, to the AND circuit 201.

The AND circuit 201 outputs the result of the logical AND operation between the output signal of the OR circuit 240 and the search enable signal sa, as the search line enable signal sena.

Further, the data generation unit 202 also includes the OR circuit 234.

The OR circuit 234 outputs the result of the logical OR operation of the respective determination results of the determination register 222, to a block control unit 206#.

For example, the OR circuit 234 outputs the "L" level when the values of the determination register 222 are all "0", and otherwise outputs the "H" level.

When the "L" level is output from the OR circuit 234, the outputs of the OR circuits 240 and 241 are the "H" level. When the search enable signal sa is the "H" level, the search line enable signal sana is changed to the "H" level regardless of the presearch operation of the search unit 210. Thus, the presearch operation is made invalid, so that the data search operation in the corresponding sub-block is performed.

Further, also in the case in which the counter value of the counter 242 reaches 8, the output of the OR circuit 241 is the "H" level. When the search enable signal sa is the "H" level, the search line enable signal sena is changed to the "H" level regardless of the presearch operation of the search unit 210.

Thus, the presearch operation is made invalid, so that the data search operation in the corresponding sub-block is performed.

Further, as a request to update the flag data, the output of the comparison circuit 245 is output to the block scan unit 204. The block scan unit 204 performs a maintenance operation to update the flag data based on the output of the comparison circuit 245.

As an example, when the number of inputs (writes) of the write enable signal wena is counted, and when the counted number reaches a predetermined number (8) or more, the maintenance operation is performed.

Figure 17:
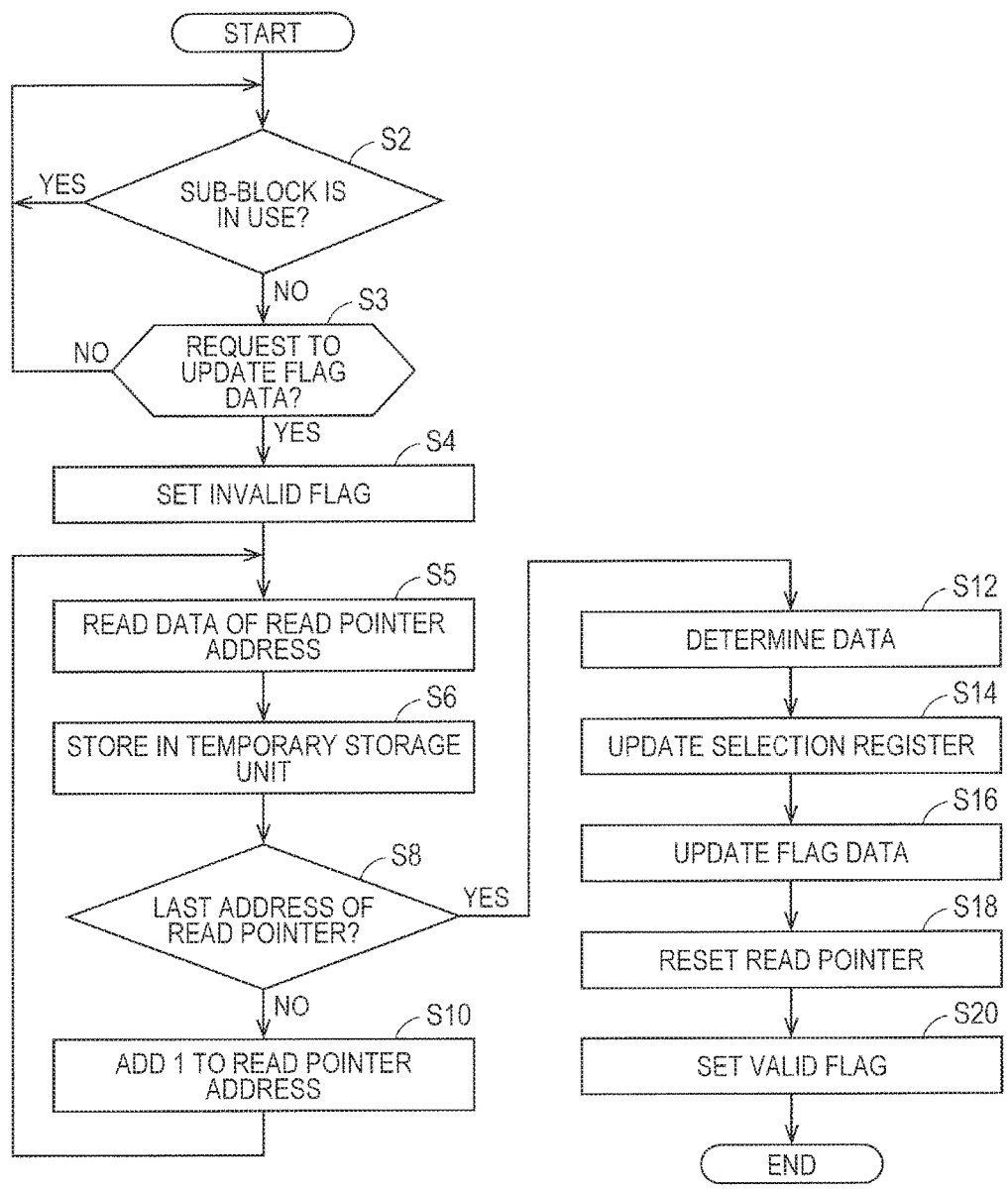
FIG. 17 is a flow chart showing the maintenance operation in the presearch sub-circuit 200.

FIG. 17 is a flow chart showing the maintenance operation in the presearch sub-circuit 200.

As shown in FIG. 17, the presearch sub-circuit 200 determines whether the corresponding sub-block is in use (step S2). In the flag data generation mode, the presearch sub-circuit 200 generates flag data, as a background process for the corresponding sub-block.

When it is determined that the sub-block is in use (YES in step S2), the presearch sub-circuit 200 maintains the state of step S2. In other words, when the sub-block is in use, the presearch sub-circuit 200 does not perform the process.

When it is determined that the sub-block is not in use (NO in step S2), the presearch sub-circuit 200 determines whether there is a request to update the flag data (step S3). More specifically, the read control part 420 determines whether a request to update the flag data of the "H" level is input from the comparison circuit 245.

When it is determined that there is no request to update the flag data (NO in step S3), the presearch sub-circuit 200 returns to step S2 and repeats the above process.

On the other hand, when it is determined that there is a request to update the flag data (YFS in step S3), the presearch sub-circuit 200 sets an invalid flag (step S4). The outputs of the OR circuits 240 and 241 are set to the "H" level. Thus, the presearch operation is made invalid, so that the data search operation in the corresponding sub-block is performed.

Next, the presearch sub-circuit 200 performs data read according to the address of the reader pointer (or the address of the entry (row) from which the data is read) (step S5). More specifically, the read control part 420 performs data read on the data stored in the sub-block 100 according to the address of the reader pointer.

The presearch sub-circuit 200 stores the read data into the temporary storage part 422 (step S6). More specifically, the read control part 420 stores the read data rdata of the corresponding sub-block 100 into the temporary storage part 422.

Next, the presearch sub-circuit 200 determines whether the address of the reader pointer is the last address (or the address of the last row) (step S8). The read control part 420 determines whether the reader pointer that specifies the read address of the sub-block is the last address.

In step S8, when it is determined that the address of the reader pointer is not the last address (NO in step S8), the presearch sub-circuit 200 counts up (+1) the address of the reader pointer. More specifically, the read control part 420 counts up the reader pointer that specifies the read address of the sub-block, to specify the read address of the next entry (row).

Then, returning to step S5, the presearch sub-circuit 200 performs the data read according to the address of the reader pointer (or the address of the entry (row) from which the data is read).

Then, when it is determined that the address of the reader pointer is the last address in step S8 (YES in step S8), the presearch sub-circuit 200 performs data determination (step S12). The data determination unit 221 determines whether all data of a predetermined area is binary as described above, based on rdata read from the corresponding sub-block.

Next, the presearch sub-circuit 200 updates the value of the selection register (step S14). The data determination unit 221 stores the determination results for each area into the determination register 222. Then, the data determination unit 221 updates the data that specifies the smallest identifier, as the value of the selection register, based on the determination value ("1") stored in the determination register 222.

Next, the presearch sub-circuit 200 updates the flag data (step S16). The flag data register 225 updates the data of a predetermined area, as the flag data, based on the data stored in the selection register 223.

Next, the presearch sub-circuit 200 resets the reader pointer (step S18). The read control part 420 sets the reader pointer that specifies the read address of the sub-block, to an initial value (as an example, "0x0").

Next, the presearch sub-circuit 200 sets a valid flag (step S20). The outputs of the OR circuits 240 and 241 are set to the "L" level. Thus, the presearch operation is made valid.

Then, the presearch sub-circuit 200 ends the process (END).

In the method described above, the presearch sub-circuit 200 sequentially reads the entries (rows) by updating the reader pointer. However, the presearch sub-circuit 200 can also be configured to read a plurality of data by performing burst read and simultaneously activating a plurality of blocks.

In the configuration described above, the maintenance operation is performed to update the flag data based on the number of writes. However, the maintenance operation is not particularly restricted to the above method. The maintenance operation can be performed by other methods.

[c2. Another Configuration of the Maintenance Operation]

The presearch sub-circuit 200 can also be configured to perform the maintenance operation regardless of the number of inputs of write enable signal wena.

Figure 18:
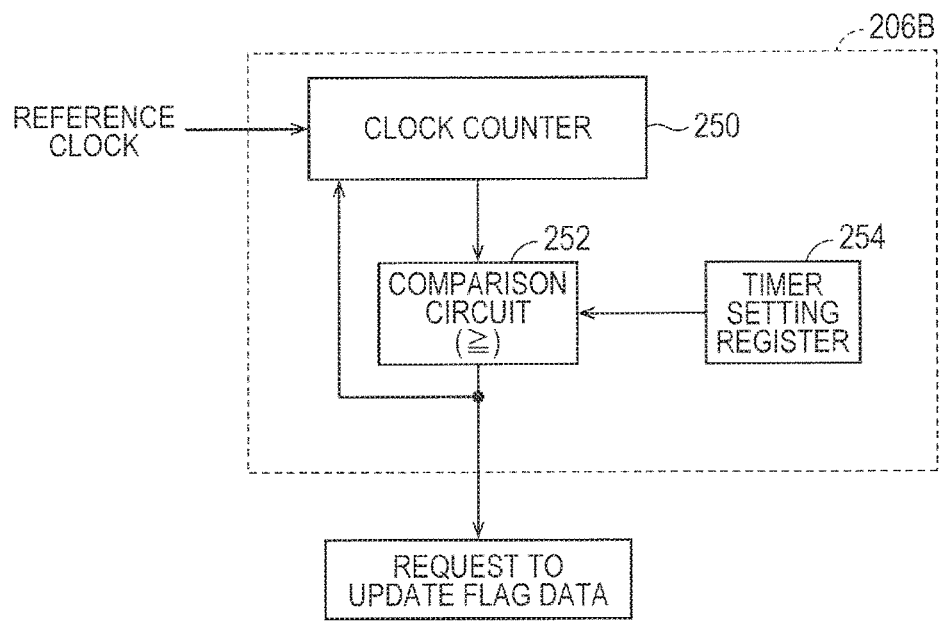
FIG. 18 is a diagram showing another configuration of a block control unit 206B.

FIG. 18 is a diagram showing another configuration of the block control unit 206B.

Referring to FIG. 18, the block control unit 206B includes a clock counter 250, a comparison circuit 252, and a timer setting register 254.

The clock counter 250 counts up the counter value in response to input of a reference clock.

The timer setting register 254 stores the timer value.

The comparison circuit 252 compares the timer value stored in the timer setting register 254 with the counter value of the clock counter 250, and outputs the comparison result. In this example, the comparison circuit 252 determines whether the counter value reaches the timer value.

When the counter value reaches the timer value, the comparison circuit 252 outputs the "H" level as a request to update the flag data.

Further, the clock counter 250 resets the counter value based on the signal from the comparison circuit 252. Then, the clock counter 250 sets the counter value to the initial value 0.

The presearch operation is made invalid according to the output ("H" level) of the comparison circuit 252, so that the data search operation in the corresponding sub-block is performed.

Further, the output of the comparison circuit 252 is output to the block scan unit 204 as a request to update the flag data. The read control part 420 of the block scan unit 204 performs the maintenance operation described above, based on the output of the comparison circuit 252.

Note that this example describes the method of using the clock counter 250. However, the maintenance operation is not particularly restricted to this configuration. The maintenance operation can also be configured with a clock means to output the comparison result based on the comparison between the value of the clock means and the timer value.

[c3. Still Another Configuration of the Maintenance Operation]

The maintenance operation can also be performed based on the write data.

Figure 19:
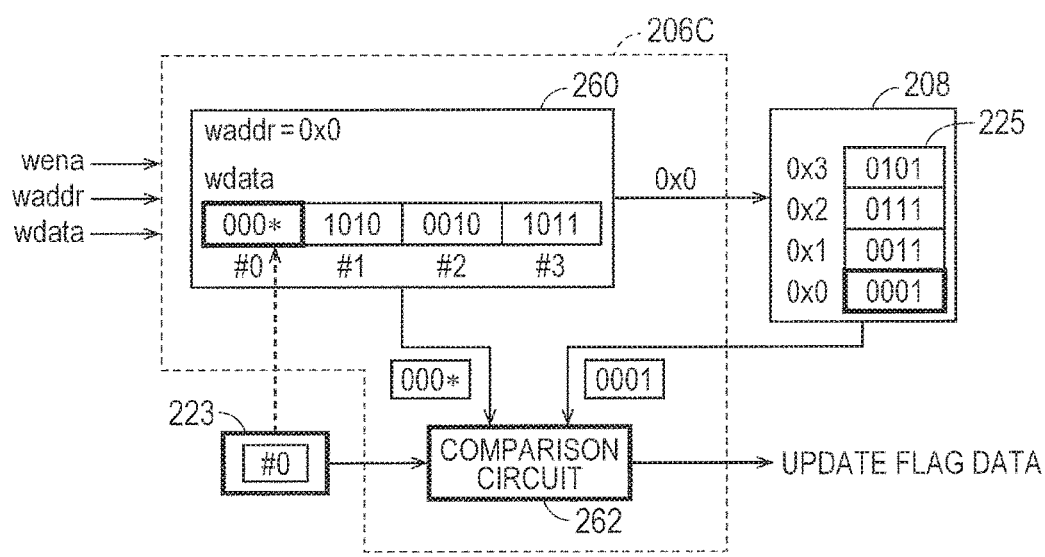
FIG. 19 is a diagram showing the configuration of a block control unit 206C.

FIG. 19 is a diagram showing the configuration of a block control unit 206C.

Referring to FIG. 19, the block control unit 206C includes a write data control unit 260 and a comparison circuit 262.

The write data control unit 260 performs a predetermined operation in response to input of write enable signal wena, write address signal waddr, and write data wdata.

The write data control unit 260 receives an input of the write data wdata in response to the write enable signal wena.

Further, of the input write data wdata, the write data control unit 260 extracts data of the area corresponding to the identifier #0 based on the data ("0") stored in the selection register 223. Then, the write data control unit 260 outputs the extracted data to the comparison circuit 262.

Further, the write data control unit 260 extracts the corresponding flag data according to the write address signal waddr. Then, the write data control unit 260 outputs the extracted flag data to the comparison circuit 262.

This example shows a case in which "0x0" is input as the write address signal waddr.

Of the data corresponding to the 0th entry (row) that correspond to the write address signal waddr, the write data control unit 260 extracts the flag data "0001" that is stored in the flag data register 225.

The comparison circuit 262 compares the write data wdata extracted by the write data control unit 260 with the flag data, to determine whether the data match, namely, whether the data is updated.

When the data do not match, the comparison circuit 262 determines that the data is updated and requests to update the flag data. The read control part 420 of the block scan unit 204 performs the maintenance operation described above, based on the output of the comparison circuit 262.

When it is determined that the data match, the comparison circuit 262 determines that the data is not updated and does not request to update the flag data.

[c4. Another Configuration of the Maintenance Operation]

The maintenance operation can be performed based on the activation of the sub-block.

Figure 20:
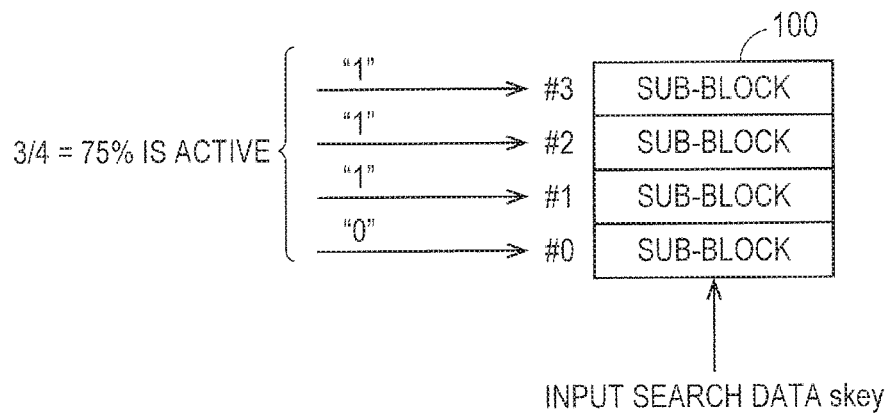
FIG. 20 is a diagram showing the maintenance operation based on the activation of the sub-block.

FIG. 20 is a diagram showing the maintenance operation based on the activation of the sub-block.

Referring to FIG. 20, a plurality of sub-blocks 100 are activated in response to the search line enable signal sena.

This example shows a case in which, of four sub-blocks 100, three sub-blocks are activated to perform a data search operation according to the input search data skey.

With respect to a plurality of sub-blocks 100, the power consumption increases as the number of activated sub-blocks 100 increases. Thus, it is possible to request an update of the flag data when the number of active sub-blocks 100 is a predetermined number or more.

Figure 21:
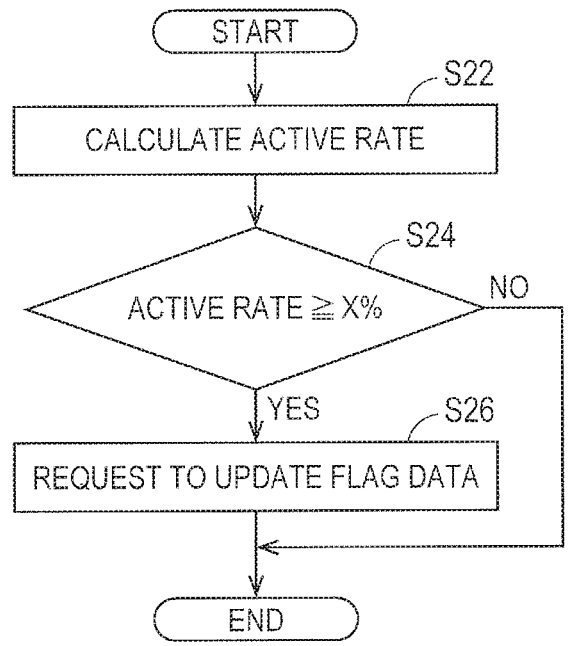
FIG. 21 is a flow chart showing the process in which a main control circuit 300 requests to update the flag data.

FIG. 21 is a flow chart showing the process in which a main control circuit 300 requests to update the flag data.

Referring to FIG. 21, the main control circuit 300 calculates the rate of active sub-blocks of all the sub-blocks (step S22). More specifically, the main control circuit 300 monitors the input state of the search line enable signal sena that is input to each sub-block, and calculates the active rate of the sub-block of all sub-blocks.

Next, the main control circuit 300 determines whether the active rate exceeds a predetermined value (X %) (step S24).

When it is determined that the active rate exceeds the predetermined value (X %) (YES in step S24), the main control circuit 300 requests to update the flag (step S26). The main control circuit 300 requests each of the presearch sub-circuits 200 to update the flag data. The read control part 420 of each presearch sub-circuit 200 performs the maintenance operation described above, based on the request from the main control circuit 300 to update the flag data.

Then, the main control circuit 300 ends the process (END).

On the other hand, when it is determined that the active rate does not exceed the predetermined value (NO in step S24), the main control circuit 300 ends the process (END) without requesting to update the flag data.

For example, when 70% is set as the predetermined value (X %), the main control circuit 300 requests to update the flag data because the active rate is 75% in the example of FIG. 20.

Note that this example describes the method of determining whether the active rate exceeds the predetermined value. However, the main control circuit 300 can compare with the average of a plurality of active rates.

Second Embodiment

Figure 22:
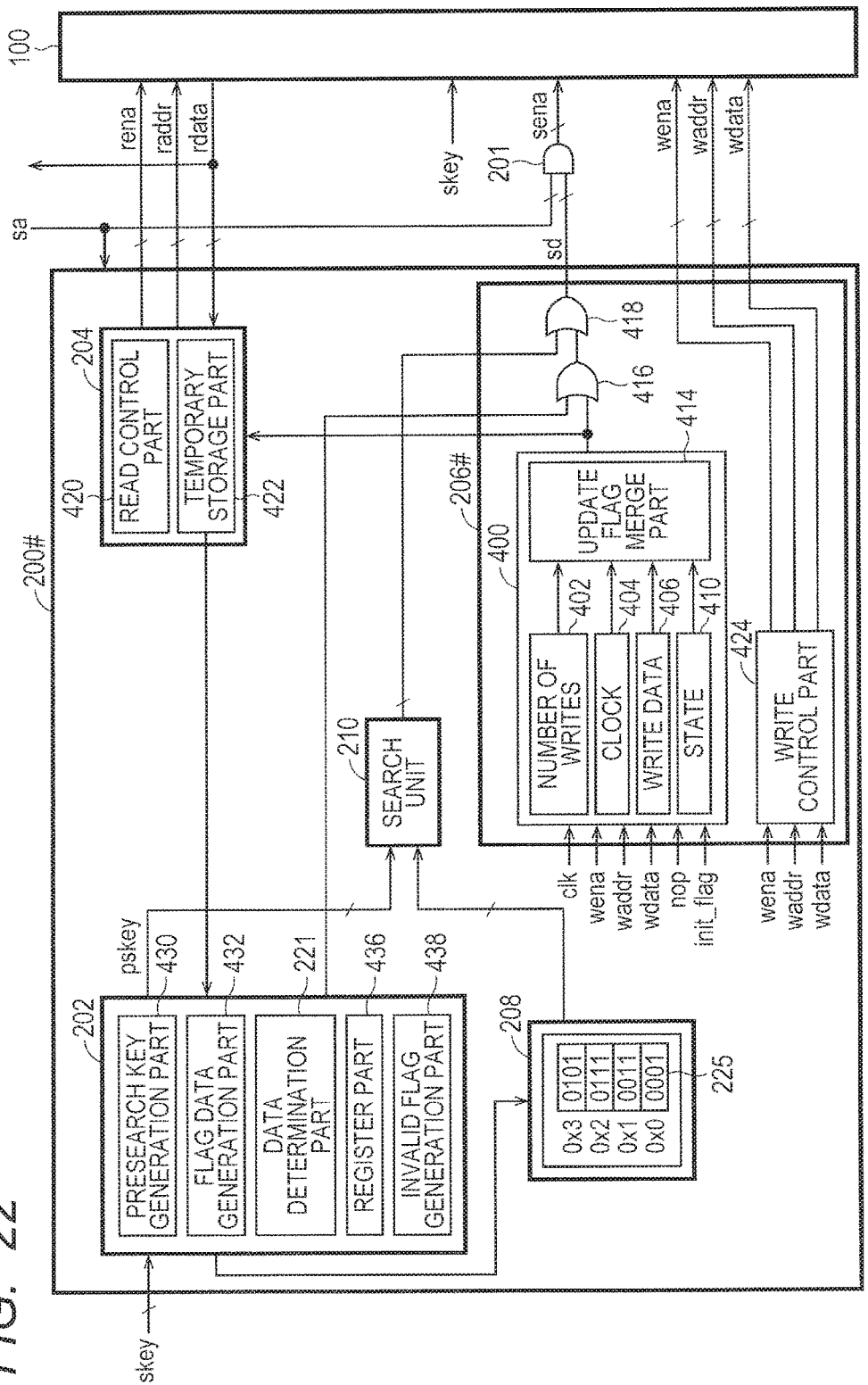
FIG. 22 is a diagram showing the overview of the configuration of a presearch sub-circuit 200#.

FIG. 22 is a diagram showing the overview of the configuration of a presearch sub-circuit 200#.

Referring to FIG. 22, the presearch sub-circuit 200# includes the block scan unit 204, the data generation unit 202, the memory unit 208, the search unit 210, and a block control unit 206#.

The block scan unit 204 includes the read control part 420 and the temporary storage part 422.

The data generation unit 202 includes a presearch key generation part 430, a flag data generation part 432, the data determination unit 221, a register part 436, and an invalid flag generation part 438.

The read control part 420 instructs the sub-block 100 to perform a data read operation in response to read enable signal rena and address signal raddr. The sub-block 100 performs the data read operation according to the instruction from the read control part 420, outputs the read data rdata to the read control part 420.

The read control part 420 stores the read data rdata read from the sub-block 100 into the temporary storage part 422.

The data determination unit 221 determines whether the data of a predetermined area are all binary valued, according to the read data rdata from the corresponding sub-block 100 that is stored in the temporary storage part 422.

The register part 436 includes the determination register 222 to store the determination result of the data determination unit 221, as well as the selection register 223 to store the data that specifies the smallest identifier based on the determination value stored in the determination register 222.

The presearch key generation part 430 includes the selector 224. In response to input of search data skey, the selector 224 specifies the presearch key pskey based on the data stored in the selection register 223.

The flag data generation part 432 includes the selector 230. The selector 230 specifies the data of the area corresponding to the entry (row) that is stored in the temporary storage part 422, as flag data, based on the data stored in the selection register 334.

The invalid flag generation part 438 includes the OR circuit 234. The OR circuit 234 outputs an invalid flag to the block control unit 206# based on the determination result of the determination register 222.

The memory unit 208 includes the flag data register 225. The flag data register 225 stores flag data used as comparison results generated by the flag data generation part 432.

The search unit 210 compares the presearch key pskey with each of the flag data stored in the flag data register 225. Then, the search unit 210 outputs comparison results to the block control unit 206#.

The block control unit 206# includes an update flag management part 400, OR circuits 416 and 418, and the write control part 424.

The update flag management part 400 manages the update of the flag data. More specifically, the update flag management part 400 includes a write number management part 402, a clock management part 404, a write data management part 406, a state management part 410, and an update flag marge part 414.

The write number management part 402 counts the number of writes in the sub-block 100, and outputs a request to update the flag data based on the number of writes. More specifically, the write number management part 402 counts the number of inputs of the write enable signal wena according to the method described with reference to FIG. 16. Then, when the number of inputs of the write enable signal wena is a predetermined number or more, the write number management part 402 requests to update the flag data.

The clock management part 404 outputs a request to update the flag data when a predetermined time period has elapsed. More specifically, the clock management part 404 counts up the reference clock clk by the clock counter according to the method described with reference to FIG. 18. Then, the clock management part 404 compares the counter value with the timer value. When the counter value reaches the timer value, the clock management part 404 requests to update the flag data.

When the flag data is updated based on the write data, the write data management part 406 outputs a request to update the flag data. More specifically, the write data management part 406 compares the write data with the flag data according to the method described with reference to FIG. 19. When the data do not match, the write data management part 406 determines that the data is updated and outputs a request to update the flag data.

The state management part 410 outputs a request to update the flag data according to the state of the presearch sub-circuit 200#. More specifically, the state management part 410 outputs a request to update the flag data in response to input of a reset signal (init_flag). Note that the state management part 410 can output a request to update the flag data not only in response to input of the reset signal (init_flag), for example, but also according to a state instruction input from the main control circuit 300. For example, it is possible to output a request to update the flag data according to a state instruction that is input from the main control circuit 300. For example, as described in FIGS. 20 and 21, the main control circuit 300 calculates the active rate of the sub-block. When it is determined that the active rate exceeds a predetermined value, the main control circuit 300 gives an instruction to the state management part 410. Upon receiving the instruction, the state management part 410 outputs a request to update the flag data. Further, the state management part 410 can also be configured to output a request to update the flag data when it is determined that the data of the corresponding sub-block 100 is updated.

Upon receiving the request to update the flag data from each management part, the update flag merge part 414 instructs the block scan unit 204 to perform a maintenance operation when it is determined that the sub-block is not in use. The update flag merge part 414 determines whether the sub-block is in use according to a control signal (nop) output from the main control circuit 300.

The OR circuit 416 outputs the result of the logical OR operation between the invalid flag generated by the invalid flag generation part 438 and the signal from the update flag merge part 414, to the OR circuit 418.

The OR circuit 418 outputs the result of the logical OR operation between the search result of the search unit 210 and the output signal of the OR circuit 416, to the AND circuit 201.

The AND circuit 201 outputs the result of the logical AND operation between the output signal of the OR circuit 418 and the search enable signal sa, as the search line enable signal sena.

When the "H" level is output from the OR circuit 416, the output of the OR circuit 418 is the "H" level regardless of the presearch operation of the search unit 210. Then, the search enable signal is changed to the "H" level. Thus, as described above, the presearch operation is made invalid, so that the data search operation in the corresponding sub-block is performed.

Note that the above description shows the method of extracting 4-bit data as the flag data, but the flag data generation is not restricted to this method. It is possible to perform an encoding process on the read data or perform a data compression process by using a hash function, to generate flag data based on the compressed data. It is also possible to generate flag data based on the data obtained by performing a filtering process, such as a bloom filter, on the read data.

Third Embodiment

Figure 23:
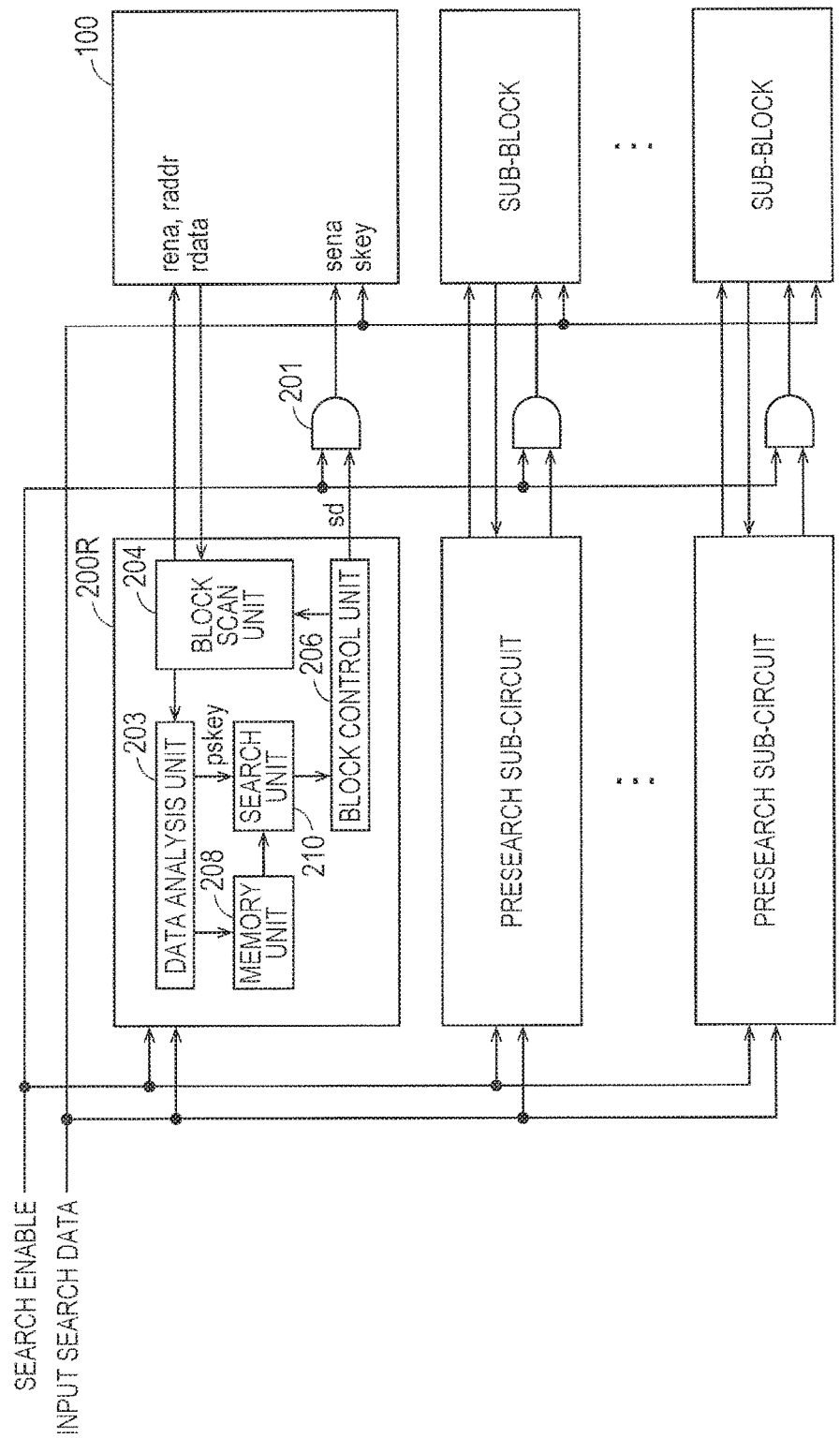
FIG. 23 is a functional block diagram showing the configuration of a presearch sub-circuit 200R based on a third embodiment.

FIG. 23 is a functional block diagram showing the configuration of a presearch sub-circuit 200R according to a third embodiment.

Referring to FIG. 23, the presearch sub-circuit 200R includes a data analysis unit 203, the block scan unit 204, the block control unit 206, a memory unit 208, and the search unit 210.

The block control unit 206 outputs various signals for controlling the sub-block 100. Further, the block control unit 206 instructs the block scan unit 204 to perform a data read operation.

The block scan unit 204 outputs the read enable signal rena and the address signal raddr to the corresponding sub-block 100 according to the instruction from the block control unit 206. The sub-block 100 outputs the read data rdata based on the read enable signal rena and the address signal raddr from the block scan unit 204. The block scan unit 204 outputs the read data rdata received from the sub-block 100 to the data generation unit 202.

The data analysis unit 203 generates statistical data based on data analysis, on the basis of the read data rdata from the sub-block 100. Further, the data analysis unit 203 generates presearch key pskey based on the input search data skey that is input to the data analysis unit 203. The data analysis unit 203 outputs the statistical data that is generated through analysis, to the memory unit 208.

The memory unit 208 stores the statistical data generated by the data analysis unit 203.

The search unit 210 compares the presearch key pskey with the statistical data stored in the memory unit 208, and outputs the comparison result to the block control unit 206.

The block control unit 206 outputs the comparison result from the search unit 210 to the AND circuit 20, as the result signal sd of the presearch operation.

The AND circuit 201 outputs the search line enable signal sena based on the result of the logical AND operation between the search result signal sd of the presearch operation from the block control unit 206, and the search enable signal sa.

The sub-block 100 performs the data search operation on the input search data skey in response to the search line enable signal sena.

Figure 24A:
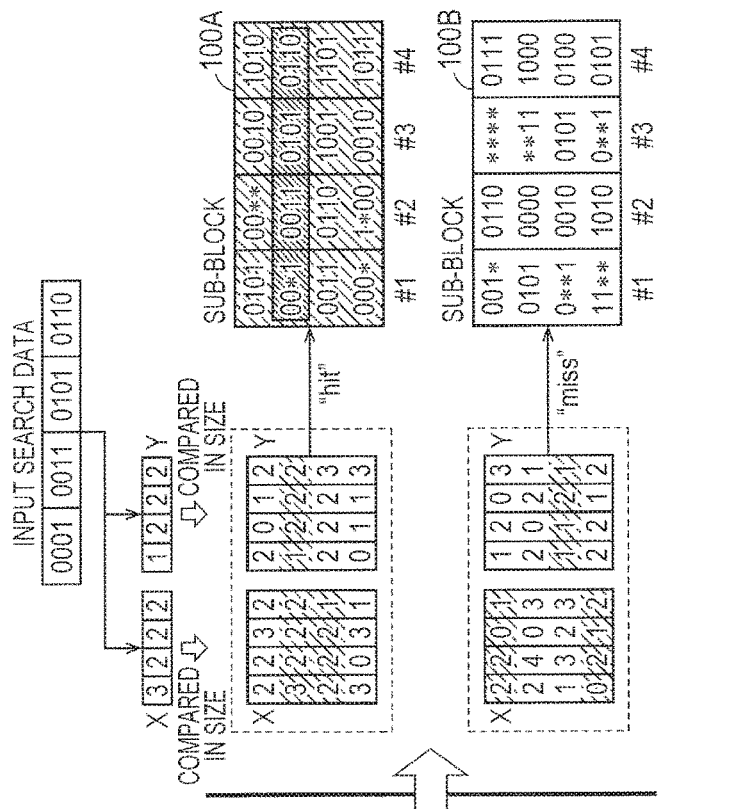
FIGS. 24A and 24B are diagrams showing the presearch operation of the presearch sub-circuit based on the third embodiment.
Figure 24B:
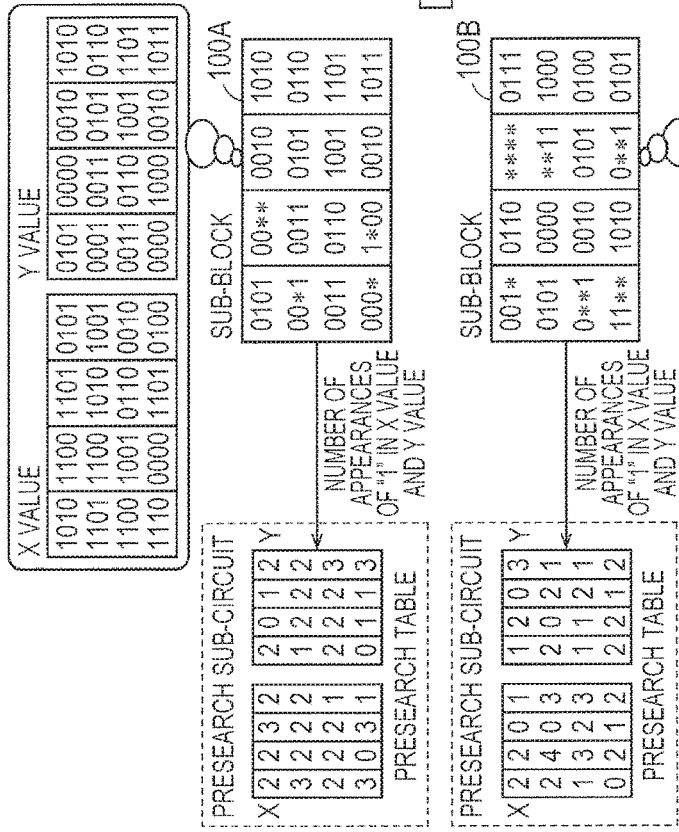

FIGS. 24A and 24B are diagrams showing the presearch operation of the presearch sub-circuit according to the third embodiment.

Referring to FIG. 24A, it shows a method of generating a presearch table in the data analysis unit 203 according to the read data rdata of the sub-block read by the block scan unit 204.

More specifically, the presearch table is generated by dividing the 16-bit entry (row) into fields of 4 bits each and by separating the data of each 4-bit field into X value and Y value.

The X value and the Y value respectively represent the values stored in the SRAM (X) cell and the SRAM (Y) cell that are described above.

As described in FIG. 2, the data "0" is represented by the X value "1" and the Y value "0". Further, the data "1" is represented by the X value "0" and the Y value "1". The data "*" is represented by the X value "0" and the Y value "0".

In this example, the number of appearances of 1 in each of the X and Y values, which are data of 4 bits each, is counted to generate statistical data as a presearch table.

FIG. 24A shows four entries (rows), showing data divided into X value and Y value, respectively, with respect to the read data of sub-blocks 100A and 100B.

Further, the figure shows a case in which the presearch table is generated by counting the number of bits with "1" for each field, with respect to the data divided into X value and Y value.

As an example, with respect to the entry (row) of the data "010100**00101010", the X value is "1010110011010101" and the Y value is "0101000000101010".

When the number of appearances of "1" in the 4-bit field is counted, the X value side is represented as "2232" and the Y value side is represented as "2012".

The presearch table is generated by performing the same procedure on other entries (rows).

FIG. 24 (B) is a diagram showing a method of comparing with the input search data.

The following describes a case in which the presearch operation is performed on the input search data "0001001101010110".

The data analysis unit 203 also divides the input search data into X value and Y value, and counts the number of appearances of "1" for the fields of 4 bits each in the same manner as described above. Then, the X value side is represented as "3222" and the Y value side is represented as "1222".

Then, the search unit 210 compares the X-value side data "3222" and the Y-value side data "1222", which are the input search data, with the presearch table.

The search unit 210 compares data for each bit to determine the difference in size. More specifically, the search unit 210 compares the value of the input search data with the value of the presearch table, to determine whether the value of the presearch table is greater than the value of the input search data, or whether the value of the presearch table is smaller than the value of the input search data. The Don't Care bit ("*") represents zero for both X value and Y value, and is not counted as statistical value. In this way, the validity of the search result can be maintained by comparing the values to determine the difference in size, instead of determining whether the values match or not.

The determination is made for each bit. When it is determined that the value of the research search table is smaller than the value of the input search data for all bits, the determination result is "hit". If there is a difference in even 1 bit, the determination result is "miss".

In this example, the data match in comparison with the presearch table that is generated based on the read data rdata of the sub-block 100A. On the other hand, the data do not match in the comparison with the presearch table that is generated based on the read data rdata of the sub-block 100B.

When the data match as a result of comparison with the input search data, the block control unit 206 outputs the search result signal sd ("1"). Thus, the data search operation is performed on the corresponding sub-block 100A. On the other hand, when the data do not match as a result of comparison with the input search data, the block control unit 206 outputs the search result signal sd ("0"). Thus, the data search operation is not performed on the corresponding sub-block 100B.

In this example, the data search operation in the sub-block 100A is performed, while the data search operation in the sub-block 100B is not performed.

In this way, it is possible to generate a presearch table by a simple method, and to perform a simple and fast presearch operation.

Further, it is also possible to simplify the configuration by reducing the number of parts of the presearch sub-circuit.

Variation

FIG. 25 is a diagram showing the presearch operation of the presearch sub-circuit based on a variation of the third embodiment.

Referring to FIG. 25A, it shows a method of generating a presearch table in the data analysis unit 203 according to the read data radata of the sub-block that is read by the block scan unit 204.

More specifically, the data analysis unit 203 generates a first presearch table according to the same method as described with reference to FIG. 24.

Next, the data analysis unit 203 generates the minimum value of each column as a second presearch table.

In this example, as the presearch table corresponding to the sub-block 100A, the minimum value (min) on the X value side is represented as "2021" and the minimum value on the Y value side is represented as "0012".

Further, as the presearch table corresponding to the sub-block 100B, the minimum value (min) on the X value side is represented as "0301" and the minimum value (min) on the Y value side is represented as "1001".

FIG. 25B shows a diagram showing a method of comparing with the input search data.

The following describes a case in which the presearch operation is performed on the input search data "0001001101010110".

The data analysis unit 203 also divides the input search data into X value and Y value, and counts the number of appearances of "1" in the fields of 4 bits each in the same manner as described above. Then, the value on the X value side is represented as "3222" and the value on the Y value side is represented as "1222".

Then, the search unit 210 compares the X value side data "3222" and the Y value side data "1222", which are the input search data, with the presearch table.

The search unit 210 compares data for each bit to determine the difference in size. More specifically, the search unit 210 compares the value of the input search data with the value of the presearch table, to determine whether the value of the presearch table is greater than the value of the input search data, or whether the value of the presearch table is smaller than the value of the input search data. The Don't Care bit ("*") represents zero for both X value and Y value, and is not counted as statistical value. In this way, the validity of the search result can be maintained by comparing the values to determine the difference in size, instead of determining whether the values match or not.

The determination is made for each bit. When it is determined that the value of the research search table is smaller than the value of the input search data for all bits, the determination result is "hit". If there is a difference in even 1 bit, the determination result is "miss".

In this example, the data match in the comparison with the presearch table that is generated based on the read data rdata of the sub-block 100A. On the other hand, the data do not match in the comparison with the presearch table that is generated based on the read data rdata of the sub-block 100B.

When the data match as a result of comparison with the input search data, the block control unit 206 outputs the search result signal sd ("1"). Thus, the data search operation is performed on the corresponding sub-block 100A. On the other hand, when the data do not match as a result of comparison with the input search data, the block control unit 206 outputs the search result signal sd ("0"). Thus, the data search operation is not performed on the corresponding sub-block 100B.

In this example, the data search operation in the sub-block 100A is performed, while the data search operation in the sub-block 100B is not performed.

In this way, it is possible to generate a presearch table by a simple method and to perform a simple and fast presearch operation.

Further, it is also possible to simplify the configuration by reducing the number of parts of the presearch sub-circuit.

Because it is configured to generate a presearch table to manage only the minimum value, the amount of data is reduced, so that there is no need to provide a plurality of registers and the like. This makes it possible to reduce the circuit area.

Although the foregoing disclosure has been described in detail based on preferred embodiments, it should be understood that this disclosure is not limited to the illustrative embodiments set forth herein, and various modifications can be made without departing from the scope and spirit of this disclosure.

What is claimed is:

1. A semiconductor device comprising:
   a plurality of sub-blocks each of which includes a memory cell array; and
   a plurality of sub-search units provided corresponding to each of the plurality of sub-blocks,
   wherein, of a plurality of data stored in each row of the memory cell array, each of the plurality of sub-blocks searches data that matches input search data according a search instruction, and outputs a search result that indicates hit or miss for each row, and
   wherein each of the plurality of sub-search units comprises:
      a flag data generation part that generates flag data for presearch in order to compare with part of the input search data, based on the plurality of data stored in the corresponding memory cell array, and
      a search part that compares part of the input search data with flag data generated by the flag data generation part, and outputs the search instruction to the corresponding one of the plurality of sub-blocks based on the comparison result,
   wherein each of the plurality of sub-search units include a control part to update the flag data for presearch,
   wherein the control part counts a number of writes in the corresponding memory cell array and updates the flag data based on the number of writes.

2. The semiconductor according to claim 1,
   wherein each of the plurality of sub-search units further includes a memory that stores the generated flag data.

3. The semiconductor device according to claim 1,
   wherein the search part is an associative memory that stores the generated flag data.

4. The semiconductor device according to claim 1,
   wherein the flag data generation part comprises a register that stores specification data to specify part of the input search data based on the plurality of data that are stored in the corresponding memory cell array.

5. The semiconductor device according to claim 4, further comprising
   a selector that selects part of the input search data based on the specification data stored in the register.

6. The semiconductor device according to claim 1,
   wherein the memory cell array comprises a plurality of areas into which the memory cell array is divided by a predetermined number of columns,
   wherein the flag data generation part determines whether all data stored in each area is binary, and
   wherein the flag data generation part generates data of the area in which all data is binary, as flag data for presearch, based on the determination result.

7. The semiconductor device according to claim 1,
   wherein the control part comprises an invalid register that stores an invalid flag.

8. The semiconductor device according to claim 1
   wherein the control part updates the flag data based on the write data to the corresponding memory cell array.

9. The semiconductor device according to claim 1,
   wherein the flag data generation part regenerates flag data for presearch in order to compare with part of the input search data, based on the data that are stored in the corresponding memory cell array, according to the instruction from the control unit.

10. The semiconductor device according to claim 1,
    wherein the memory cell array comprises a plurality of areas into which it is divided by a predetermined number of columns,
    wherein the flag data generation part determines whether partial areas of the data stored in each area are all binary, and
    wherein the flag data generation part generates the data of the partial area as flag data for presearch, based on the determination result.

11. The semiconductor device according to claim 1,
    wherein the each of the plurality of sub-search units further comprises a data read control circuit that read out the plurality of data stored in the corresponding memory cell array, and
    wherein the flag data generation part generates the flag data based on data read by the data read control circuit.

12. The semiconductor device according to claim 1,
    wherein one of the plurality of sub-search units supplies the search instruction to the corresponding one of the plurality of sub-blocks based on the comparison result between the input search data and data in the one of the plurality of sub-search units, and
    wherein the flag data generation part generates the flag data to be compared with the input search data in the one of the plurality of sub-search units based on data stored in the memory cell array in the corresponding one of the plurality of sub-blocks.

13. The semiconductor device according to claim 1,
    wherein the flag data comprises data for comparing with the part of the input search data before a search operation for the sub-blocks.

14. The semiconductor device according to claim 1,
    wherein a search operation for each the sub-blocks is performed based on the search instruction from an associated one of the sub-search units.

15. A semiconductor device comprising:
    a plurality of sub-blocks each of which includes a memory cell array; and
    a plurality of sub-search units provided corresponding to each of the plurality of sub-blocks,
    wherein, of a plurality of data stored in each row of the memory cell array, each of the plurality of sub-blocks searches data that matches input search data according a search instruction, and outputs a search result that indicates hit or miss for each row, and
    wherein each of the plurality of sub-search units comprises:
       a flag data generation part that generates flag data for presearch in order to compare with part of the input search data, based on the plurality of the data stored in the corresponding memory cell array, and
       a search part that compares part of the input search data with flag data generated by the flag data generation part, and outputs the search instruction to the corresponding one of the plurality of sub-blocks based on the comparison result,
    wherein each of the plurality of sub-search units include a control part to update the flag data for presearch, and
    wherein the semiconductor device further comprises a management unit that calculates the rate of the search instruction to the corresponding sub-block from the sub-search unit, and instructs to update the flag data based on the calculation result.

16. A semiconductor device comprising:
    a sub-block unit including a plurality of content addressable memory cells and configured to compare between an input search data and entry data stored in the content addressable memory cells and to output a search result that indicates hit or miss;

a pre-search unit includes:
- a block control unit configured to generate an instruction of read operation,
- a block scan unit configured to instruct the sub-block unit to perform a data read operation based on the instruction of read operation from the block control unit, and to receive read data from the sub-block unit,
- a flag data generator configured to generate a flag data based on the read data from the sub-block unit,
- a flag data register storing the flag data, and
- a comparator configured to compare between the flag data stored in the flag data register and the input search data and to generates the presearch result signal based on the comparison result, wherein the sub-block unit performs a search operation based on the presearch result signal and a search enable signal.

17. The semiconductor device according to claim 16,
wherein the block control unit receives a write enable signal for the sub-block unit, and generates the instruction of the read data operation based on the write enable signal to update the flag data.

18. The semiconductor device according to claim 16,
wherein the block control unit generates the instruction of the read data operation to update the flag data at a predetermined time interval.

19. The semiconductor device according to claim 16,
wherein the flag data comprises a part of the read data from the sub-block unit, and
wherein the comparator compares between the flag data and a part of the input search data for the sub-block unit before a search operation for the sub-block unit using the input search data.

* * * * *